United States Patent
Arai

(10) Patent No.: US 7,218,149 B2
(45) Date of Patent: May 15, 2007

(54) OUTPUT OR BIDIRECTIONAL BUFFER CIRCUIT WHICH TOLERATES AN EXTERNAL INPUT VOLTAGE THAT IS HIGHER THAN AN INTERNAL POWER SUPPLY VOLTAGE

(75) Inventor: Kenji Arai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 137 days.

(21) Appl. No.: 11/072,434

(22) Filed: Mar. 7, 2005

(65) Prior Publication Data

US 2005/0200381 A1    Sep. 15, 2005

(30) Foreign Application Priority Data

Mar. 11, 2004    (JP)    .............................. 2004/069479

(51) Int. Cl.
*H03K 19/0175*    (2006.01)
(52) U.S. Cl. .......................................... 326/83; 326/86
(58) Field of Classification Search ............ 326/81–83, 326/86, 87, 68
See application file for complete search history.

(56) References Cited

U.S. PATENT DOCUMENTS 5,973,511 A  * 10/1999  Hsia et al. ..................... 326/81
6,269,042 B1    7/2001  Kawano et al.
6,282,456 B1    8/2001  Kim
6,359,315 B1 *  3/2002  Pillay et al. ................. 257/368
6,927,602 B2 *  8/2005  Ker et al. ..................... 326/81

FOREIGN PATENT DOCUMENTS

JP    10163852    6/1998
JP    20000196436    7/2000

* cited by examiner

*Primary Examiner*—James H. Cho
(74) *Attorney, Agent, or Firm*—Volentine & Whitt, P.L.L.C.

(57) ABSTRACT

A semiconductor integrated circuit includes a first transistor coupled between the electrical source terminal and the output terminal. The first transistor provides an output signal based on a power supply voltage to the output terminal. The semiconductor integrated circuit further includes a second transistor coupled with a control electrode of the first transistor and the output terminal. The semiconductor integrated circuit still further includes a voltage adjusting circuit coupled between the output terminal and a control electrode of the second transistor. The voltage adjusting circuit turns ON the second transistor when the output terminal receives an external voltage which is higher than the power supply voltage.

26 Claims, 12 Drawing Sheets

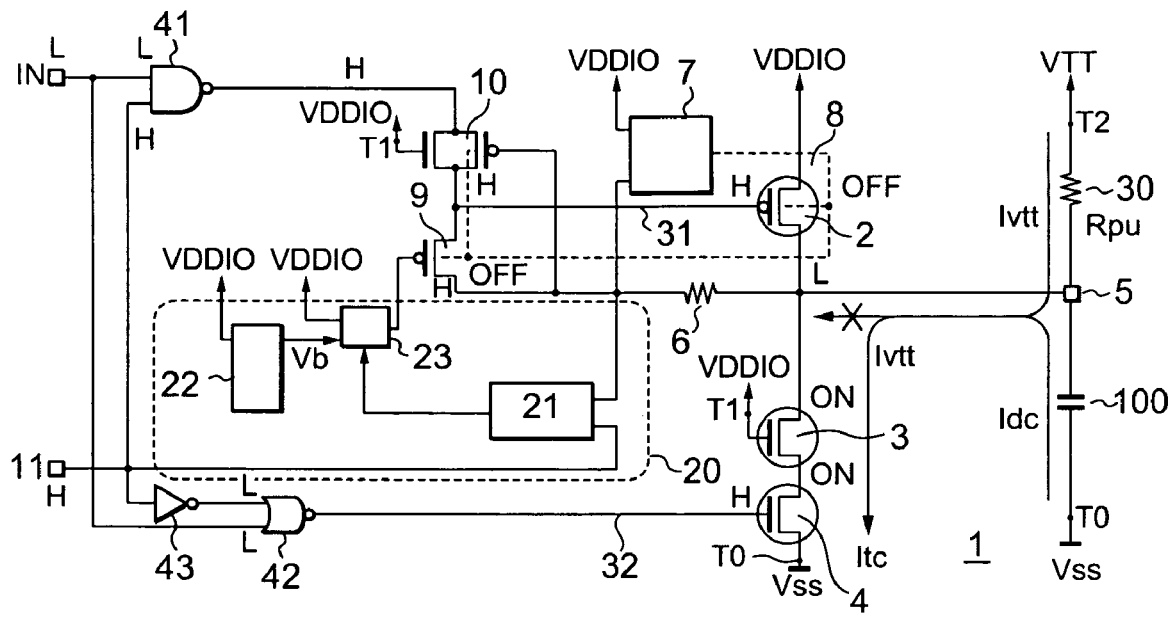
Fig. 3A
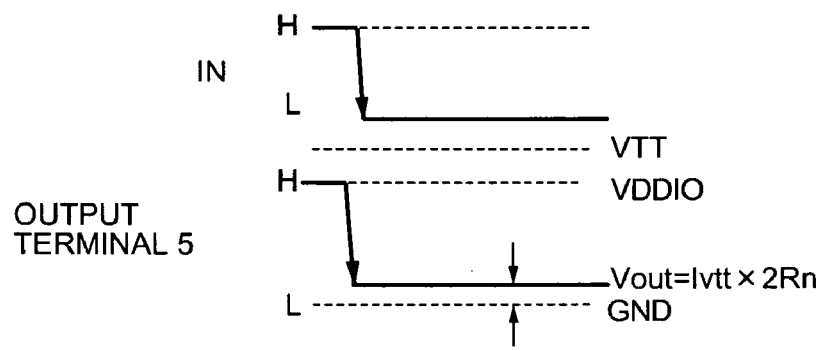
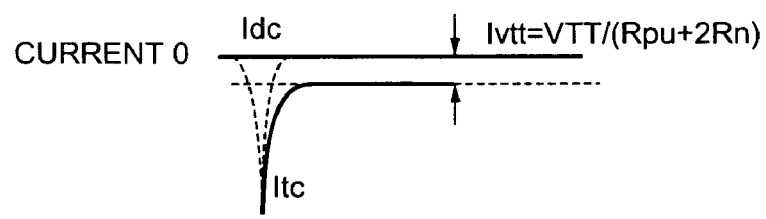
Fig. 3B

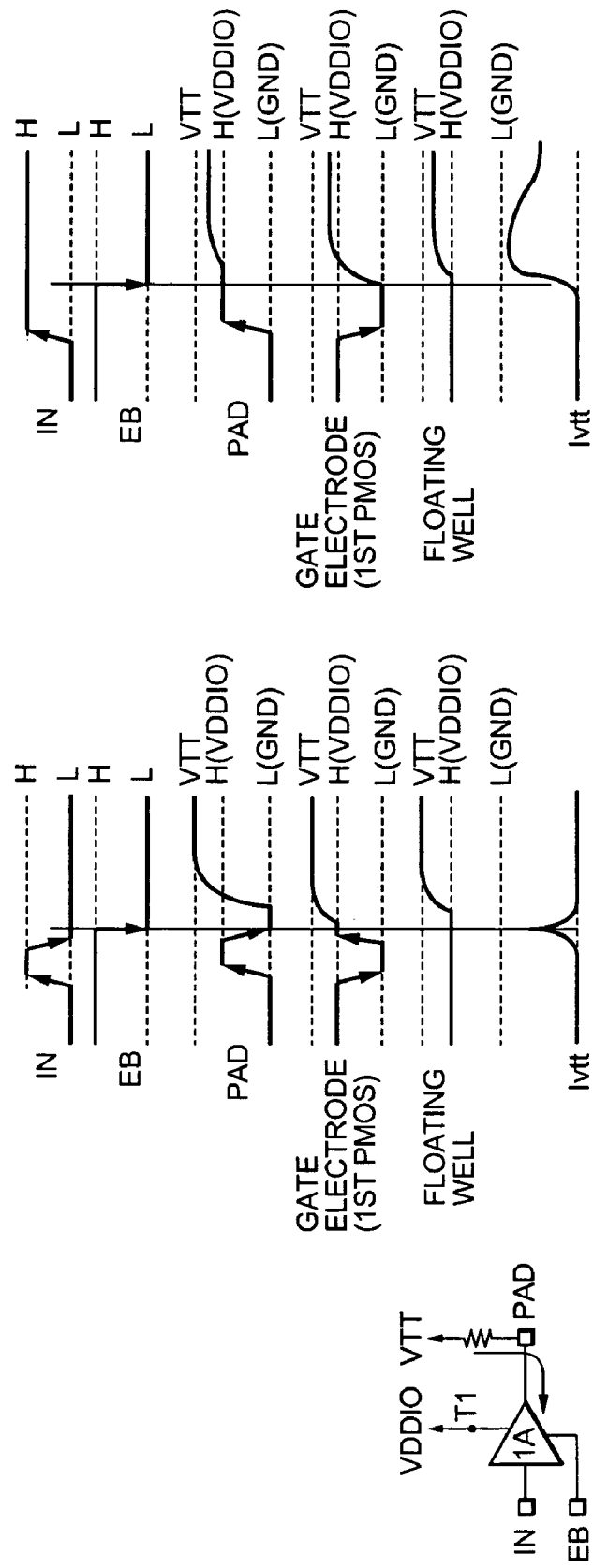

OUTPUT OR BIDIRECTIONAL BUFFER CIRCUIT WHICH TOLERATES AN EXTERNAL INPUT VOLTAGE THAT IS HIGHER THAN AN INTERNAL POWER SUPPLY VOLTAGE

BACKGROUND OF THE INVENTION

1. Field of the Invention

The present invention relates to a semiconductor integrated circuit outputting an output signal based on an internal power supply voltage, in particular, an output or bidirectional buffer circuit which tolerates an external input voltage that is higher than the internal power supply voltage. This is a counterpart of and claims priority to Japanese Patent Application No. 2004-69479 filed on Mar. 11, 2004, which is herein incorporated by reference.

2. Description of the Related Art

A system Large Scale Integration circuit (hereinafter referred to as "LSI") is composed of a plurality of semiconductor integrated circuits. Since an area of one semiconductor chip on which the semiconductor integrated circuits are disposed is limited, there may be power supply voltages different from each other with respect to a signal interface between the semiconductor integrated circuits. Therefore, when the semiconductor integrated circuits which respectively operate with different power supply voltages (for example, 3V and 5V) are coupled with each other, the semiconductor integrated circuit which operates with a lower power supply voltage may require a signal interface which can correspond to the semiconductor integrated circuit which operates with a higher power supply voltage. On such an occasion as this, the semiconductor integrated circuit which operates with the lower power supply voltage may commonly use a tolerant input-output circuit, which is capable of receiving the higher power supply voltage externally, as the signal interface. Alternatively, the semiconductor integrated circuit which operates with the lower power supply voltage may commonly use a tolerant input-output circuit, which can pull up the low power supply voltage, as the signal interface.

In a Patent Document 1 (Japanese Patent Publication Laid-open No. 2000-196436), an input-output circuit has a diode-connected PMOS transistor 11 and a P-conductive type MOS (hereinafter referred to as "PMOS") transistor 12 as an output transistor and a protection transistor which are coupled in series between an internal electrical source terminal and an output terminal PAD, and the PMOS transistor 12 has an electrically floating well of a semiconductor substrate. That is, the Document 1 shows that an electrical current, caused by an external power supply voltage which is higher than the internal power supply voltage, is prevented from flowing constantly from the output terminal into the internal electrical source terminal by turning the PMOS transistor 12 OFF when the external voltage is applied to the output terminal PAD.

On the other hand, an input-output circuit has an output PMOS transistor 7 coupled between an internal electrical source terminal and an output terminal in a Patent Document 2 (Japanese Patent Publication Laid-open No. Hei 10-163852). In Document 2, after the input-output circuit is disabled [disenable] with the electrical potential of the output terminal being kept at the "H" level, the output terminal receives an external power supply voltage higher than the internal power supply voltage. In this instance, an electrical potential of a gate electrode of the output PMOS transistor 7 is changed from a ground voltage to the external power supply voltage through the internal power supply voltage. When the gate electrode of the output PMOS transistor 7 is changed from the internal power supply voltage to the external power supply voltage, a tolerant control circuit operates using an external current caused by the external power supply voltage.

However, since the input-output circuit of the Document 1 has the two PMOS transistors coupled in series, the input-output circuit requires double or more usual sizes of the PMOS transistors 11 and 12 in order to realize a desired power of driving and its characteristics of rise time and fall time when the input-output circuit is used as an output circuit. That is, the input-output circuit described in the Document 1 requires a greater area on which the PMOS transistors are formed. Also, in the input-output circuit of the Document 2, until the output PMOS transistor 7 receives the internal power supply voltage after receiving the ground voltage, the external current substantially flows into the output PMOS transistor 7. That is, an electrical potential of the output terminal can not be promptly pulled up by the external power supply voltage until the output PMOS transistor 7 is turned OFF. Therefore, it takes a few seconds or more time than usual to pull up the electrical potential of the output terminal, which is increased by an external resistance and a parasitic capacitance. On such an occasion as this, the external current which ranges from several microamperes to several ten microamperes passes through the output PMOS transistor 7 during a few milliseconds. As a result, electrical power consumption in the input-output circuit may be increased.

SUMMARY OF THE INVENTION

An object of the present invention is to restrain the external current caused by the external power supply voltage from flowing into the internal electrical source terminal while the time to adjust the semiconductor integrated circuit which outputs the output signal to the external power supply voltage is restrained from increasing.

According to an aspect of the present invention, for achieving the above-mentioned object, there is provided a semiconductor integrated circuit which includes a first transistor coupled with an electrical source terminal and an output terminal. The electrical source terminal receives a power supply voltage and the output terminal outputs an output signal. The semiconductor integrated circuit further includes a second transistor coupled with a control electrode of the first transistor and the output terminal. The semiconductor integrated circuit still further includes a voltage adjusting circuit coupled between the output terminal and a control electrode of the second transistor. The voltage adjusting circuit turns ON the second transistor when the output terminal receives an external voltage which is higher than the power supply voltage.

The above and further aspects and novel features of the invention will more fully appear from the following detailed description, appended claims and the accompanying drawings.

BRIEF DESCRIPTION OF THE DRAWINGS

FIG. 3A is a schematic equivalent circuit diagram for describing the operation of the semiconductor integrated circuit in the first operation case of Table 1.

FIG. 3B is a waveform diagram for describing the operation of the semiconductor integrated circuit in the first operation case of Table 1.

FIG. 7A is a schematic circuit diagram for describing the output circuit which does not have the second PMOS transistor that turns OFF the first PMOS transistor by the external power supply voltage.

FIG. 7B is a waveform diagram for describing the operations of the output circuit in FIG. 7A during which an electrical potential of the output terminal is increased from the ground voltage to the external power supply voltage.

FIG. 7C is a waveform diagram for describing the operations of the output circuit in FIG. 7A during which the electrical potential of the output terminal is increased from the internal power supply voltage to the external power supply voltage.

DETAILED DESCRIPTION OF THE PREFERRED EMBODIMENTS

Embodiments of the present invention will be described hereinafter with references to the accompanying drawings. The drawings used for this description illustrate major characteristic parts of embodiments in order that the present invention will be easily understood. However, the invention is not limited by these drawings.

Figure 1:
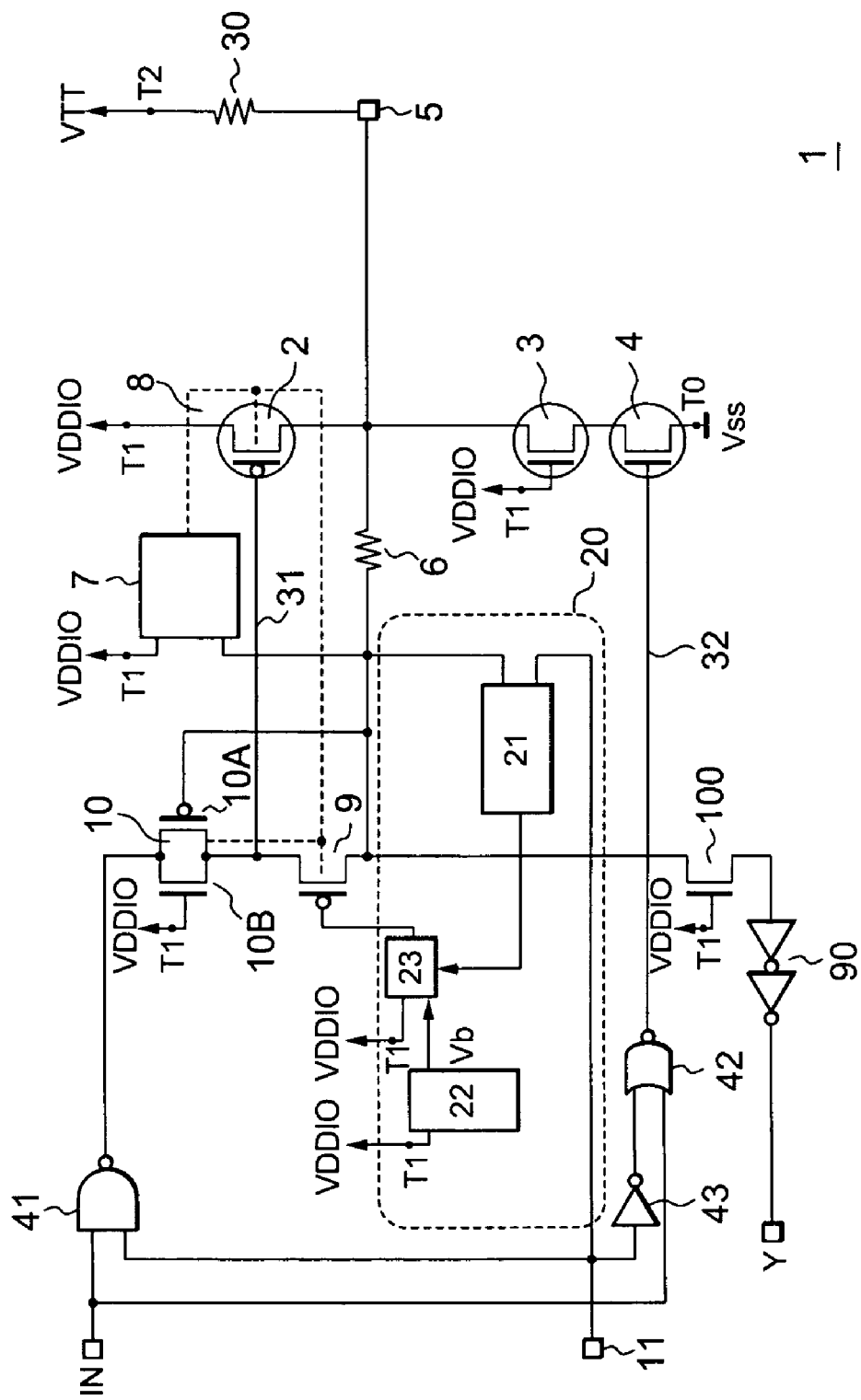
FIG. 1 is a schematic circuit diagram for describing a semiconductor integrated circuit according to a first preferred embodiment of the present invention.

FIG. 1 is a schematic circuit diagram for describing a semiconductor integrated circuit 1 according to a first preferred embodiment of the present invention. The semiconductor integrated circuit 1 generates an output signal Vout at an output terminal 5 based on an internal power supply voltage VDDIO. Also, the semiconductor integrated circuit 1 is capable of adjusting to an external power supply voltage VTT higher than the internal power supply voltage VDDIO. This semiconductor integrated circuit 1 may be an input-output circuit or an output tri-state buffer circuit.

The semiconductor integrated circuit 1 has a first PMOS transistor 2 coupled between an internal electrical source terminal T1 and the output terminal 5 and also has output N-conductive type MOS (hereinafter referred to as "NMOS") transistors 3 and 4 coupled in series between the output terminal 5 and a ground source terminal T0. The internal electrical source terminal T1 receives the internal power supply voltage VDDIO, and the ground source terminal T0 receives a ground voltage Vss. The internal power supply voltage VDDIO is used in order to generate the output signal Vout. Furthermore, the semiconductor integrated circuit 1 has an input protective resistance element 6 coupled to the output terminal 5, a floating well charging circuit 7 coupled between the internal electrical source terminal T1 and the input protective resistance element 6, a second PMOS transistor 9 and a transfer gate 10 coupled to the input protective resistance element 6, a voltage adjusting circuit 20 couple to the second PMOS transistor 9, and logical circuits including a NAND circuit 41, a NOR circuit 42 and an inverter 43.

The first PMOS transistor 2, used as an output transistor, is formed to be disposed on a floating well 8 of a semiconductor substrate. The first PMOS transistor 2 has a control electrode, that is, a gate electrode coupled to the second PMOS transistor 9 through a node 31. The first PMOS transistor 2 further has a source electrode coupled to the internal electrical source terminal T1 and a drain electrode coupled to both the output terminal 5 and a drain electrode of the NMOS transistor 3. The NMOS transistor 3 has a source electrode coupled to a drain electrode of the NMOS transistor 4, the drain electrode coupled to both the drain electrode of the first PMOS transistor 2 and the output terminal 5, and a gate electrode coupled to the internal electrical source terminal T1 so that the NMOS transistor 3 can be normally turned ON. Hereupon, when the NMOS transistor 3 is turned ON, the NMOS transistor 3 allows a current to pass between the drain electrode and the source electrode. In addition, a PMOS transistor or a resistance element may be coupled between the gate electrode of the NMOS transistor 3 and the internal electrical source terminal T1 for an electrostatic discharge protection. The NMOS transistor 4 has a gate electrode coupled to the NOR circuit 42 through a node 32, a source electrode coupled to the ground source terminal T0, and the drain electrode coupled to the source electrode of the NMOS transistor 3.

The output terminal 5 is coupled to an external electrical source terminal T2 through an external resistance element 30. The external electrical source terminal T2 receives the external power supply voltage VTT higher than the internal power supply voltage VDDIO. The external power supply voltage VTT and the external resistance element 30 are used so that the semiconductor integrated circuit 1 can adjust to the external power supply voltage VTT when an after-mentioned judgment circuit 21 judges that the semiconductor integrated circuit 1 is disabled. Also, the output terminal 5 is coupled to the floating well charging circuit 7 and a drain electrode of the second PMOS transistor 9. Furthermore, the output terminal 5 is coupled to a drain electrode of an NMOS transistor 100 through the input protective resistance element 6. The NMOS transistor 100 has a gate electrode coupled to the internal electrical source terminal T1 and a source electrode coupled to an input terminal of an input buffer 90. The input buffer 90 has an output terminal coupled to a terminal Y which is coupled to an internal circuit of the semiconductor integrated circuit 1. The input buffer 90 generates a logical signal which corresponds to the output signal Vout. The input buffer 90 is commonly composed of two inverters coupled in series with each other. The floating well charging circuit 7 is coupled to the output terminal 5 through the input protective resistance element 6.

The second PMOS transistor 9 has a source electrode coupled to the gate electrode of the first PMOS transistor 2 and the transfer gate 10, the drain electrode coupled to the input protective resistance element 6, and a control electrode, that is, a gate electrode coupled to the voltage adjusting circuit 20. The transfer gate 10 is composed of PMOS and NMOS transistors 10A and 10B coupled together in parallel with each other. The PMOS and NMOS transistors 10A and 10B respectively have source electrodes coupled to the NAND circuit 41. The NAND circuit 41 receives an input signal IN from an internal circuit of a semiconductor device and an enable signal EB from an enable terminal 11. The PMOS and NMOS transistors 10A and 10B respectively have drain electrodes coupled to the source electrode of the second PMOS transistor 9. Also, the PMOS transistor 10A has a gate electrode coupled to the drain electrode of the second PMOS transistor 9, and the NMOS transistor 10B has a gate electrode coupled to the internal electrical source terminal T1. Hereupon, for example, the input signal IN is a signal which is output from the internal circuit of the semiconductor device such as a flip-flop circuit or an inverter. The enable signal EB is a signal which enables the semiconductor integrated circuit 1 to operate so that the output signal Vout can be generated from the semiconductor integrated circuit 1 responsive to the input signal IN. Also, the input signal IN is input to the NOR circuit 42, and the enable signal EB is input to the NOR circuit 42 through the inverter 43. The NOR circuit 42 has an output terminal coupled to the gate electrode of the NMOS transistor 4.

The voltage adjusting circuit 20 has a judgment circuit 21, a bias circuit 22 and a voltage switching circuit 23. The judgment circuit 21 is coupled to the output terminal 5 and the enable terminal 11 to generate judgment signals for the voltage switching circuit 23 based on electrical potentials of the output terminal 5 and the enable terminal 11. That is, the judgment circuit 21 judges whether the semiconductor integrated circuit 1 is enabled or not, and then generates first and second judgment signals Sj1 and Sj2. The bias circuit 22 generates a bias voltage Vb based on the internal power supply voltage VDDIO for the voltage switching circuit 23. The bias voltage Vb is lower than the internal power supply voltage VDDIO. The voltage switching circuit 23 is coupled to the second PMOS transistor 9, the internal electrical source terminal T1, the bias circuit 22 and the judgment circuit 21. The voltage switching circuit 23 selectively outputs either the internal power supply voltage VDDIO or the bias voltage Vb to the gate electrode of the second PMOS transistor 9 responsive to the first and second judgment signals Sj1 and Sj2.

Hereupon, the operations of the semiconductor integrated circuit 1 based on the voltage adjusting circuit 20 is briefly described below and in Table 1. As shown in Table 1, there are four cases of the operations in accordance with the electrical potentials of the output terminal 5 and the enable terminal 11. The four cases include a first through fourth operation cases.

As shown in the first operation case of Table 1, when the input signal IN is turned to a "Low" level (hereinafter referred to as "L" level) and the enable signal EB is turned to a "High" level (hereinafter referred to as "H" level), the voltage adjusting circuit 20 provides the internal power supply voltage VDDIO to the gate electrode of the second PMOS transistor 9. On such an occasion as this, an electrical potential of the output terminal 5 is kept at the "L" level. As shown in the second operation case of Table 1, when the input signal IN is turned to the "H" level and the enable signal EB is turned to the "H" level, the voltage adjusting circuit 20 provides the internal power supply voltage VDDIO to the gate electrode of the second PMOS transistor 9. On such an occasion as this, the electrical potential of the output terminal 5 is kept at the "H" level. That is, the semiconductor integrated circuit 1 normally operates so as to generate the output voltage Vout based on the input signal IN according to the first and second operation cases. On the other hand, shortly after the enable signal EB is turned from the "H" level to the "L" level, the output voltage Vout is kept as it was before the change of the enable signal EB. That is, if the input signal IN is kept at the "L" level before the change of the enable signal EB, the electrical potential of the output terminal 5 is still kept at the "L" level shortly after the change of the enable signal EB. On such an occasion as this, as shown in the third operation case of Table 1, the voltage adjusting circuit 20 provides the internal power supply voltage VDDIO to the gate electrode of the second PMOS transistor 9 and the electrical potential of the output terminal 5 is pulled up from the "L" level toward the external power supply voltage VTT. Also, if the input signal IN is kept at the "H" level before the change of the enable signal EB, the electrical potential of the output terminal 5 is still kept at the "H" level shortly after the change of the enable signal EB. On such an occasion as this, as shown in the fourth operation case of Table 1, the voltage adjusting circuit 20 provides the bias voltage Vb to the gate electrode of the second PMOS transistor 9 and the electrical potential of the output terminal 5 is pulled up from the "H" level toward the external power supply voltage VTT.

Figure 2:
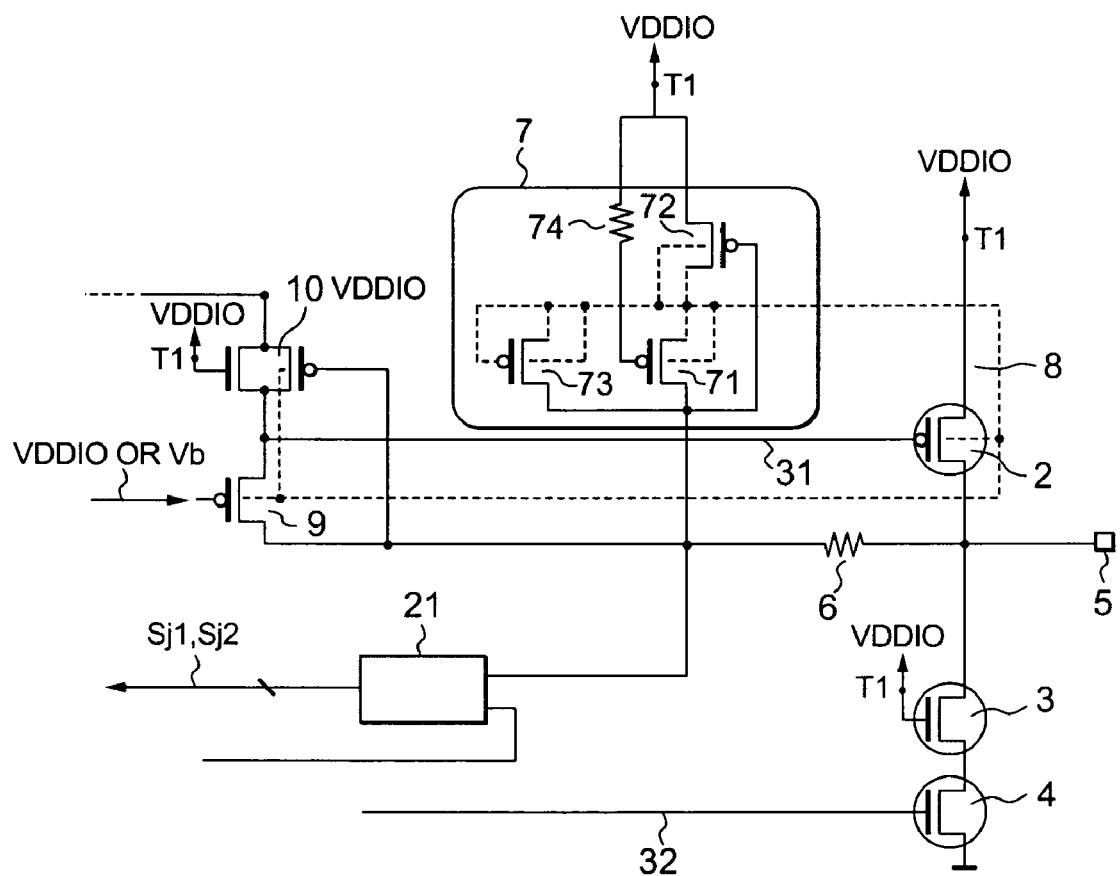
FIG. 2 is a circuit diagram for mainly describing the floating well charging circuit of the semiconductor integrated circuit in FIG. 1.

FIG. 2 is a circuit diagram for mainly describing the floating well charging circuit 7 of the semiconductor integrated circuit 1 in FIG. 1. The floating well charging circuit 7 has PMOS transistors 71 through 73 disposed on the floating well 8 of the semiconductor substrate and a resistance element 74. The PMOS transistor 71 has a gate electrode coupled to the internal electrical source terminal T1 through the resistance element 74, a source electrode coupled to the floating well 8 and a drain electrode coupled to the input protective resistance element 6 and the drain electrode of the second PMOS transistor 9. The PMOS transistor 72 has a gate electrode coupled to the drain electrode of the PMOS transistor 71, a source electrode coupled to the internal electrical source terminal T1, and a drain electrode coupled to the floating well 8. The PMOS transistor 73 has gate and source electrodes coupled to the floating well 8 and a drain electrode coupled to the drain electrode of the PMOS transistor 71.

The operation of the semiconductor integrated circuit according to the first preferred embodiment of the present invention is described in detail below and in sequence from the above-mentioned first to fourth operation case.

FIG. 3A is a schematic equivalent circuit diagram for describing the operation of the semiconductor integrated circuit 1 in the first operation case of Table 1. FIG. 3B is a waveform diagram for describing the operation of the semiconductor integrated circuit 1 in the first operation case of Table 1. When the input signal IN is turned to the "L" level as shown in FIG. 3B and the enable signal EB is turned to the "H" level, the NAND circuit 41 generates a signal which is turned to the "H" level for the node 31 through the transfer gate 10. That is, the gate electrode of the first PMOS transistor 2 receives the internal power supply voltage VDDIO, and then the first PMOS transistor 2 is turned OFF. Hereupon, being turned OFF means that the first PMOS transistor 2 does not allow a current to pass through itself. Meanwhile, the NOR circuit 42 generates a signal which is turned to the "H" level for the node 32. That is, the gate electrode of the NMOS transistor 4 receives the internal power supply voltage VDDIO, and then the NMOS transistor 4 is turned ON. Therefore, the output voltage Vout which is kept substantially at the ground voltage Vss is output from the output terminal 5.

When the external electrical source terminal T2 is coupled to the output terminal 5 through the external resistance element 30, a discharging current Idc caused by a parasitic capacitance 100 with respect to the output terminal 5 flows into the ground source terminal T0 through the NMOS transistors 3 and 4. Then, an external direct current Ivtt caused by the external power supply voltage VTT flows into the ground source terminal T0 through the external resistance element 30 and the NMOS transistors 3 and 4 as shown in FIG. 3B. When it is assumed that the external resistance element 30 has an external resistance value Rpu and each of the NMOS transistors 3 and 4 has an ON-state resistance value Rn, the external direct current Ivtt is calculated using the following equation (1).

$$Ivtt = VTT/(Rpu + 2Rn) \qquad (1)$$

Therefore, to be exact, when the input signal IN is turned to the "L" level and the enable signal EB is turned to the "H" level, the output voltage Vout, which is slightly higher than the ground voltage Vss as shown in FIG. 3B, is calculated using the following equation (2).

$$Vout = Ivtt \times 2Rn \qquad (2)$$

Thus, a total current Itc which flows into the ground source terminal T0 is changed as shown in FIG. 3B. On such an occasion as this, the PMOS transistor 72 of the floating well charging circuit 7 is turned ON because the gate electrode of the PMOS transistor 72 receives the output voltage Vout which is kept substantially at the ground voltage Vss. As a result, the floating well 8 begins to be charged to receive the internal power supply voltage VDDIO through the PMOS transistor 72. After the floating well 8 is charged to receive the internal power supply voltage VDDIO, the PMOS transistor 72 is turned OFF.

Since the internal power supply voltage VDDIO is supplied to the gate and source electrodes of the PMOS transistor 73, the PMOS transistor 73 is turned OFF. Also, the voltage adjusting circuit 20 operates as stated above and as shown in the first operation case of Table 1. That is, the judgment circuit 21 judges that the semiconductor integrated circuit 1 is enabled because of the enable signal EB which is kept at the "H" level, and then generates the first and second judgment signals Sj1 and Sj2 for the voltage switching circuit 23 responsive to the electrical potentials of the output terminal 5 and the enable terminal 11. The voltage switching circuit 23 receives the internal power supply voltage VDDIO from the internal electrical source terminal T1 and the bias voltage Vb from the bias circuit 22, and then provides the internal power supply voltage VDDIO to the gate electrode of the second PMOS transistor 9 responsive to the first and second judgment signals Sj1 and Sj2. Meanwhile, the source electrode of the second PMOS transistor 9 receives the internal power supply voltage VDDIO as stated above. Therefore, the second PMOS transistor is turned OFF. Since the first and second PMOS transistors 2 and 9 and the PMOS transistors 72 and 73 are all turned OFF as stated above, a current can not flow from the internal electrical source terminal T1 into the output terminal 5. As a result, the output voltage Vout can be stable as shown in FIG. 3B.

Figure 4A:
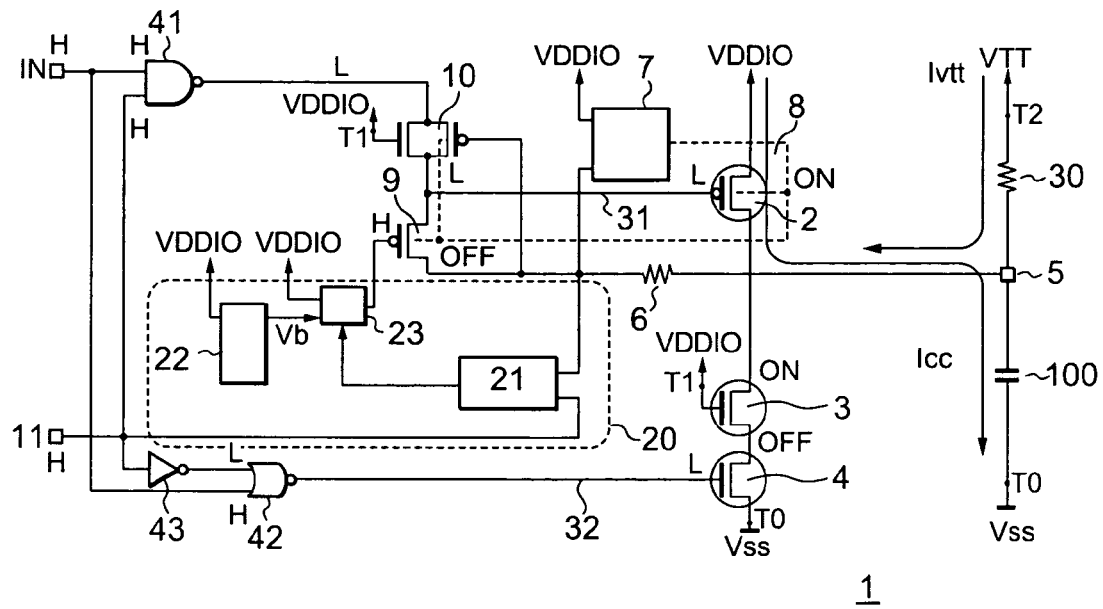
FIG. 4A is a schematic equivalent circuit diagram for describing the operation of the semiconductor integrated circuit in the second operation case of Table 1.
Figure 4B:
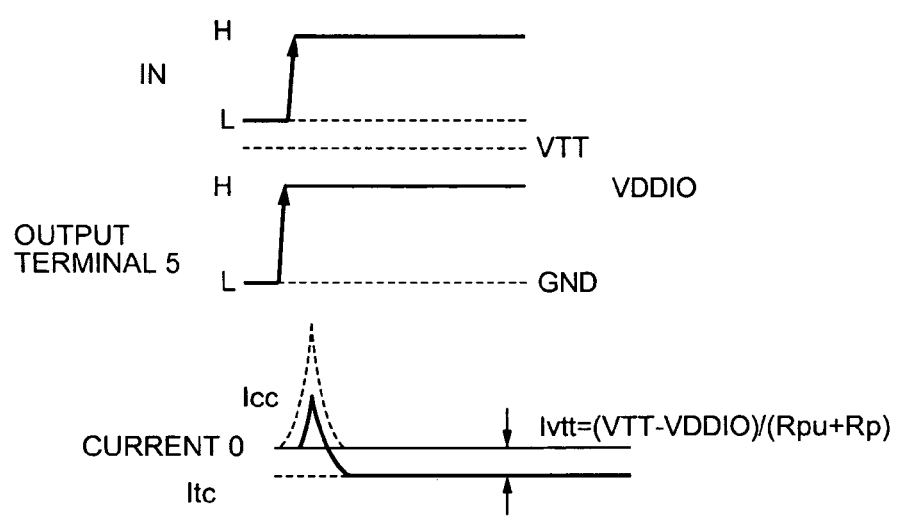
FIG. 4B is a waveform diagram for describing the operation of the semiconductor integrated circuit in the second operation case of Table 1.

FIG. 4A is a schematic equivalent circuit diagram for describing the operation of the semiconductor integrated circuit 1 in the second operation case of Table 1. FIG. 4B is a waveform diagram for describing the operation of the semiconductor integrated circuit 1 in the second operation case of Table 1. When the input signal IN is turned to the "H" level as shown in FIG. 4B and the enable signal EB is turned to the "H" level, the NAND circuit 41 generates a signal which is turned to the "L" level for the node 31 through the transfer gate 10. That is, the gate electrode of the first PMOS transistor 2 receives the ground voltage Vss, and then the first PMOS transistor 2 is turned ON. Hereupon, being turned ON means that the first PMOS transistor 2 allows a current to pass through itself. Meanwhile, the NOR circuit 42 generates a signal which is turned to the "L" level for the node 32. That is, the gate electrode of the NMOS transistor 4 receives the ground voltage Vss, and then the NMOS transistor 4 is turned OFF. Therefore, the output voltage Vout which is kept substantially at the internal power supply voltage VDDIO is output from the output terminal 5.

When the external electrical source terminal T2 is coupled to the output terminal 5 through the external resistance element 30, a charging current Icc flows from the internal electrical source terminal T1 to the parasitic capacitance 100 through the first PMOS transistor 2 and the output terminal 5. Then, the external direct current Ivtt flows from the external electrical source terminal T2 into the internal electrical source terminal T1 through the external resistance element 30 and the first PMOS transistor 2 as shown in FIG. 4B.

When it is assumed that the first PMOS transistor 2 has an ON-state resistance value Rp, the external direct current Ivtt is calculated using the following equation (3).

$$Ivtt = (VTT - VDDIO)/(Rpu + Rp) \qquad (3)$$

Usually, since the ON-state resistance value Rp is much smaller than the external resistance value Rpu, the output voltage Vout is kept substantially at the internal power supply voltage VDDIO. That is, when the enable signal EB is turned to the "H" level (that is, the semiconductor integrated circuit 1 is enabled) and the input signal IN is turned to the "H" level, the output voltage Vout is not kept at the external power supply voltage VTT but is kept substantially at the internal power supply voltage VDDIO. Thus, the total current Itc which flows from the external electrical source terminal T2 into the output terminal 5 is changed as shown in FIG. 4B.

On such an occasion as this, the PMOS transistor 72 of the floating well charging circuit 7 is turned OFF because the gate electrode of the PMOS transistor 72 receives the output voltage Vout which is kept substantially at the internal power supply voltage VDDIO. As a result, the floating well 8 begins to be charged to receive the internal power supply voltage VDDIO through the PMOS transistor 73. After the floating well 8 is charged to receive the internal power supply voltage VDDIO, the PMOS transistors 71 and 73 are turned OFF as well as the PMOS transistor 72. Also, the voltage adjusting circuit 20 operates as stated above and as shown in the second operation case of Table 1. That is, the judgment circuit 21 judges that the semiconductor integrated circuit 1 is enabled because of the enable signal EB which is kept at the "H" level, and then generates the first and second judgment signals Sj1 and Sj2 for the voltage switching circuit 23 responsive to the electrical potentials of the output terminal 5 and the enable terminal 11. The voltage switching circuit 23 receives the internal power supply voltage VDDIO from the internal electrical source terminal T1 and the bias voltage Vb from the bias circuit 22, and then provides the internal power supply voltage VDDIO to the gate electrode of the second PMOS transistor 9 responsive to the first and second judgment signals Sj1 and Sj2. Meanwhile, the source electrode of the second PMOS transistor 9 receives the ground voltage Vss as stated above. Therefore, the second PMOS transistor is turned OFF. Since the second PMOS transistor 9 and the NMOS transistors 3 and 4 are all turned OFF as stated above, a current can not flow from the output terminal 5 into the ground source terminal T0. As a result, the output voltage Vout can be stable as shown in FIG. 4B.

Figure 5A:
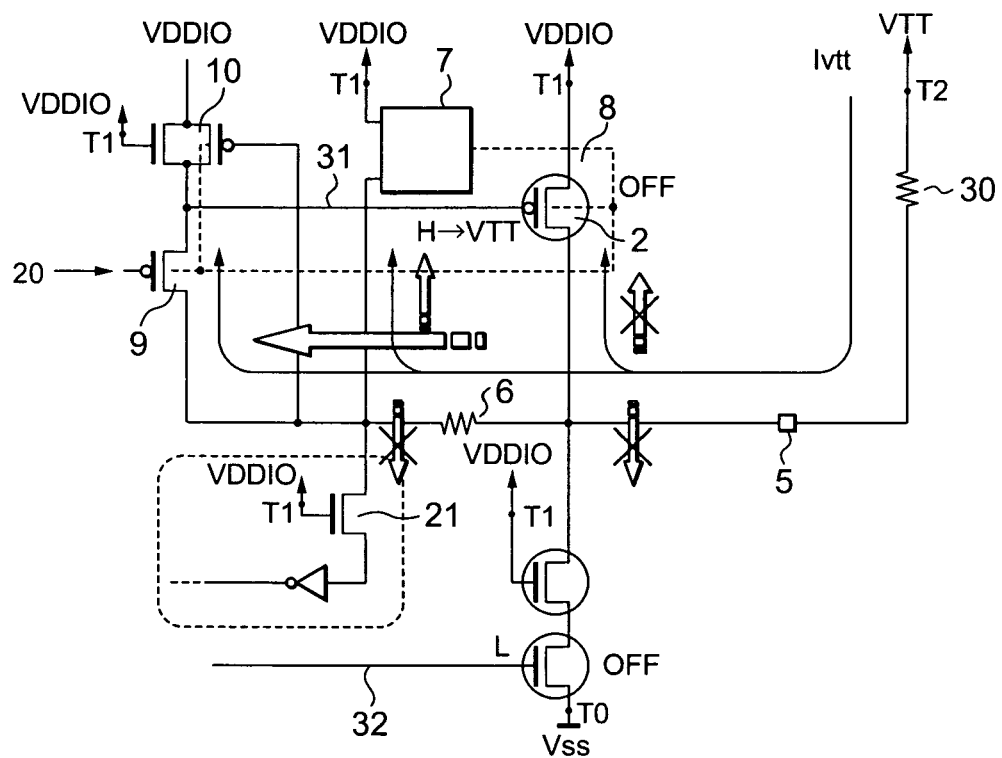
FIG. 5A is a schematic equivalent circuit diagram for describing the operation of the semiconductor integrated circuit in the third operation case of Table 1.
Figure 5B:
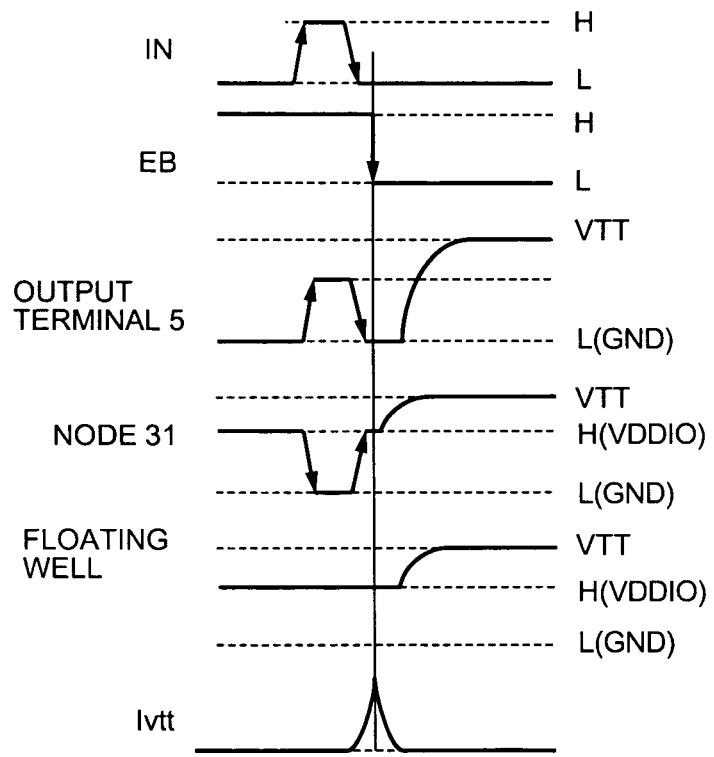
FIG. 5B is a waveform diagram for describing the operation of the semiconductor integrated circuit in the third operation case of Table 1.

FIG. 5A is a schematic equivalent circuit diagram for describing the operation of the semiconductor integrated circuit 1 in the third operation case of Table 1. FIG. 5B is a waveform diagram for describing the operation of the semiconductor integrated circuit 1 in the third operation case of Table 1.

When the input signal IN is kept at the "L" level just before the enable signal EB is turned from the "H" level to the "L" level, the electrical potential of the output terminal 5 is kept substantially at the ground voltage Vss and the first PMOS transistor 2 is turned OFF because the electrical potential of the node 31 is kept at the "H" level (that is, the internal power supply voltage VDDIO) as described above in the first operation case of Table 1. Then, the enable signal EB is turned to the "L" level with the input signal kept at the "L" level as shown in FIG. 5B. Since the NAND circuit 41 receives the input signal IN which is kept at the "L" level in this instance, the NAND circuit 41 successively generates the signal which is kept at the "H" level for the node 31 through the transfer gate 10. Thus the gate electrode of the second PMOS transistor 2 receives the internal power supply voltage VDDIO. That is, the second PMOS transistor 2 is successively kept OFF. Meanwhile, the voltage adjusting circuit 20 provides the internal power supply voltage VDDIO to the gate electrode of the second PMOS transistor 9 as described in the third operation case of Table 1. That is, the second PMOS transistor 9 is kept OFF shortly after the enable signal EB is turned to the "L" level.

On the other hand, the NOR circuit 42 generates the signal which is kept at the "H" level for the node 32 just before the enable signal EB is turned from the "H" level to the "L" level as described above in the first operation case of Table 1. However, when the enable signal EB is turned to the "L" level, the NOR circuit 42 generates a signal which is turned to the "L" level for the node 32. That is, the gate electrode of the NMOS transistor 4 receives the ground voltage Vss, and then the NMOS transistor 4 is turned OFF as shown in FIG. 5A.

Next, the operations of the semiconductor integrated circuit 1 are described below when the external electrical source terminal T2 is coupled to the output terminal 5 through the external resistance element 30 with the electrical potentials of the output terminal 5 and the enable terminal 11 at the "L" level. In this instance, since the NMOS transistor 4 is turned OFF as described above, the external direct current Ivtt caused by the external power supply voltage VTT can not flow into the ground source terminal T0.

Just after the external power supply voltage VTT is supplied to the output terminal 5, the gate and source electrodes of the second PMOS transistor 9 receives the internal power supply voltage VDDIO and the drain electrode of the second PMOS transistor 9 receives the external power supply voltage VTT through the output terminal 5. Thus, the external direct current Ivtt flows from the external electrical source terminal T2 into the node 31 through the external resistance element 30 and the second PMOS transistor 9. That is, the electrical potential of the node 31 is increased by the external power supply voltage VTT. After that, the second PMOS transistor 9 is turned OFF. Hereupon, being turned OFF means that the second PMOS transistor 9 does not allow a current to pass through itself. Also, just after the external power supply voltage VTT is supplied to the output terminal 5, the gate and source electrodes of the first PMOS transistor 2 receives the internal power supply voltage VDDIO and the drain electrode of the first PMOS transistor 2 receives the external power supply voltage VTT. That is, the first PMOS transistor 2 is once turned ON shortly after the external power supply voltage VTT is supplied to the output terminal 5. However, when the gate electrode of the first PMOS transistor 2 receives the external power supply voltage VTT through the node 31 as described above, the first PMOS transistor 2 is immediately turned OFF again. Therefore, the external direct current Ivtt can not pass through the first and second PMOS transistors 2 and 9.

Furthermore, the external power supply voltage VTT is supplied to the output terminal 5, the floating well 8 is charged to receive the external power supply voltage VTT by the PMOS transistors 71 and 73 of the floating well charging circuit 7. After the floating well 8 is charged to receive the external power supply voltage VTT, the PMOS transistors 71 through 73 of the floating well charging circuit 7 are turned OFF.

As described above, when the external power supply voltage VTT is supplied to the output terminal 5, the first and second PMOS transistors 2 and 9, the PMOS transistors 71 through 73 of the floating well charging circuit 7, and the NMOS transistor 4 are all turned OFF. Therefore, the electrical potential of the output terminal 5 can be promptly increased from the ground voltage Vss to the external power supply voltage VTT.

Figure 6A:
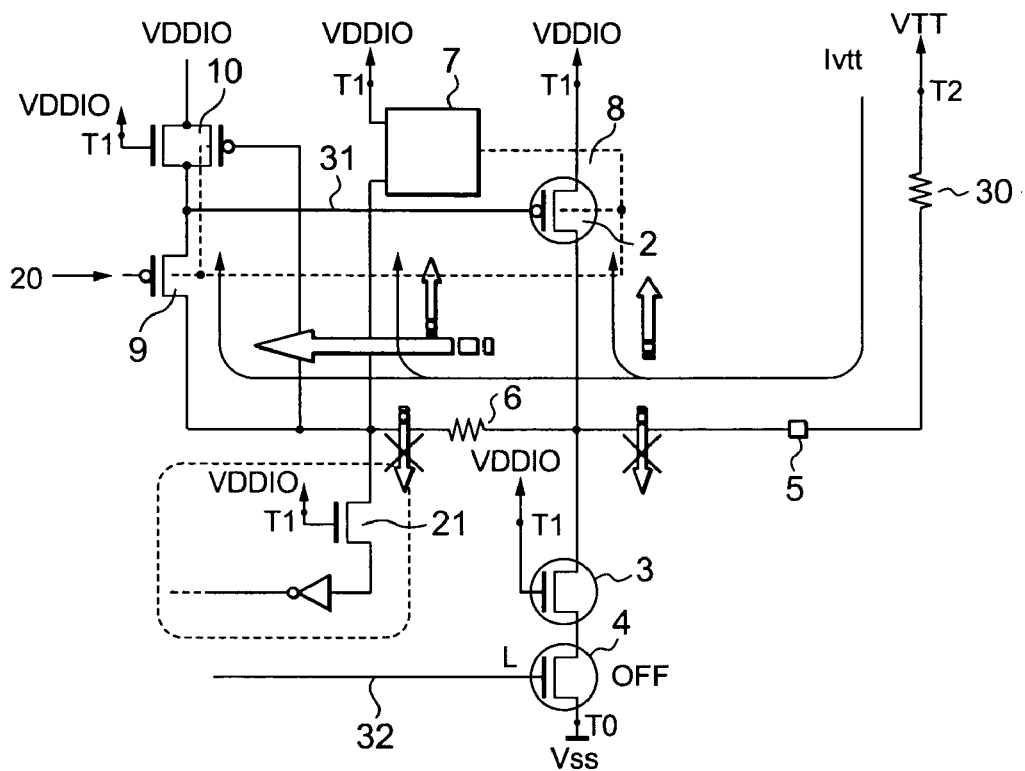
FIG. 6A is a schematic equivalent circuit diagram for describing the operation of the semiconductor integrated circuit in the fourth operation case of Table 1.
Figure 6B:
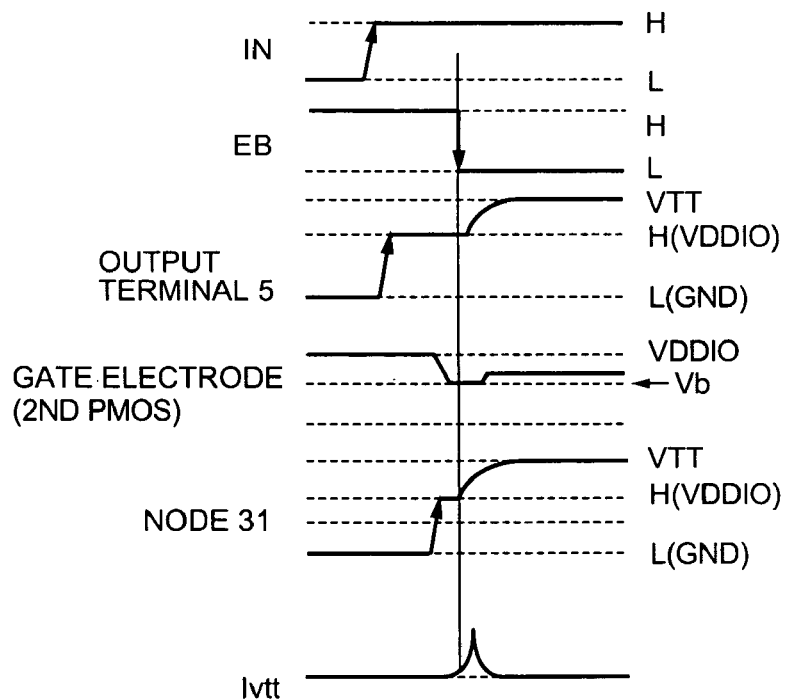
FIG. 6B is a waveform diagram for describing the operation of the semiconductor integrated circuit in the fourth operation case of Table 1.

FIG. 6A is a schematic equivalent circuit diagram for describing the operation of the semiconductor integrated circuit 1 in the fourth operation case of Table 1. FIG. 6B is a waveform diagram for describing the operation of the semiconductor integrated circuit 1 in the fourth operation case of Table 1.

When the input signal IN is kept at the "H" level just before the enable signal EB is turned from the "H" level to the "L" level, the electrical potentials of the nodes 31 and 32 are kept at the "L" level (that is, the ground voltage Vss) through the NAND circuit 41 and the NOR circuit 42 as described above in the second operation case of Table 1. Therefore, the first PMOS transistor 2 is turned ON and the NMOS transistor 4 is turned OFF. As a result, the electrical potential of the output terminal 5 is kept substantially at the "H" level, that is, the internal power supply voltage VDDIO.

Then, the enable signal EB is turned to the "L" level with the input signal kept at the "H" level as shown in FIG. 6B. Since the NOR circuit 42 receives a signal which is turned to the "H" level through the inverter 43 in this instance, the NOR circuit 42 generates the signal which is successively kept at the "L" level for the node 32. That is, the gate electrode of the NMOS transistor 4 receives the ground voltage Vss, and then the NMOS transistor 4 is successively kept OFF even after the enable signal EB is turned to the "L" level as shown in FIG. 6A.

Meanwhile, since the NAND circuit 41 receives the enable signal EB which is turned at the "L" level, the NAND circuit 41 generates the signal which is turned to the "H" level (that is, the internal power supply voltage VDDIO) for the node 31 through the transfer gate 10. In this regard, however, after the NAND circuit 41 begins to generate the signal of the "H" level and before the electrical potential of the gate electrode of the first PMOS transistor 2 reaches at the internal power supply voltage VDDIO, the first PMOS transistor 2 remains slightly kept ON. On the other hand, the voltage adjusting circuit 20 provides the bias voltage Vb (lower than the internal power supply voltage VDDIO) to the gate electrode of the second PMOS transistor 9 as described in the fourth operation case of Table 1. That is, the second PMOS transistor 9 is turned ON while the first PMOS transistor 2 is slightly kept ON. Hereupon, being turned ON for the second PMOS transistor 9 means that the second PMOS transistor 9 allows a current to pass through itself. Accordingly, an ON-state resistance of the first PMOS transistor 2 is higher than an ON-state resistance of the second PMOS transistor 9 shortly after the NAND circuit 41 generates the signal of the "H" level for the node 31. Therefore, when the external electrical source terminal T2 is coupled to the output terminal 5 through the external resistance element 30 with the electrical potential of the output terminal 5 at the "H" level and the enable terminal 11 at the "L" level in the above instance, the external direct current Ivtt caused by the external power supply voltage VTT flows into the node 31 through the second PMOS transistor 9 prior to flowing into the internal electrical source terminal T1 through the first PMOS transistor 2. Thus, the electrical potential of the node 31 is increased not only by the internal power supply voltage VDDIO through the NAND circuit 41 but also by the external power supply voltage VTT through the second PMOS transistor 9. That is, the electrical potential of the gate electrode of the first PMOS transistor 2 is increased at high speed. After the electrical potential of the gate electrode of the first PMOS transistor 2 reaches at the external power supply voltage VTT, the first PMOS transistor 2 is turned OFF. Hereupon, being turned OFF means that the first PMOS transistor 2 does not allow a current to pass through itself. Also, when the electrical potential of the node 31 reaches at the external power supply voltage VTT, the electrical potentials of the drain and source electrodes of the second PMOS transistor 9 are equal to each other. Therefore, the second PMOS transistor 9 is turned OFF. Then, the electrical potential of the gate electrode of the second PMOS transistor 9 is slightly increased by a coupling capacitance between the gate electrode of the second PMOS transistor 9 and the output terminal 5.

Furthermore, when the electrical potential of the output terminal 5 is kept at the "H" level (that is, the internal power supply voltage VDDIO) before receiving the external power supply voltage VTT, the PMOS transistor 72 of the floating well charging circuit 7 is turned OFF because the gate electrode of the PMOS transistor 72 receives the internal power supply voltage VDDIO. As a result, the floating well 8 begins to be charged to receive the internal power supply voltage VDDIO through the PMOS transistor 73. After the floating well 8 is charged to receive the internal power supply voltage VDDIO, the PMOS transistors 71 and 73 are turned OFF as well as the PMOS transistor 72. Then, when the external power supply voltage VTT is supplied to the output terminal 5, the drain electrode of the PMOS transistor 71 receives the external power supply voltage VTT and the gate electrode of the PMOS transistor 71 receives the internal power supply voltage VDDIO. Thus, the floating well 8 is charged to receive the external power supply voltage VTT through the PMOS transistor 71. Since the gate and drain electrodes of the PMOS transistor 72 receives the external power supply voltage VTT, the PMOS transistor 72 remains kept OFF and then the external direct current Ivtt can not flow from the external electrical source terminal T2 into the internal electrical source terminal T1 through the output terminal 5. Since the gate and source electrodes of the PMOS transistor 73 are coupled to the floating well 8 and the drain electrode of the PMOS transistor 73 is coupled to the output terminal 5, the floating well 8 is also charged to receive the external power supply voltage VTT through the PMOS transistor 73. After the floating well 8 is charged, the PMOS transistors 71 and 73 are turned OFF. As a result, the floating well 8 is charged to receive the external power supply voltage VTT while the external direct current Ivtt can not flow into the internal electrical source terminal T1.

On the other hand, since the NMOS transistor 4 remains still kept OFF even after the enable signal EB is turned to the "L" level as described above, the external direct current Ivtt caused by the external power supply voltage VTT can not flow into the ground source terminal T0.

As described above, shortly after the external power supply voltage VTT is supplied to the output terminal 5, the first and second PMOS transistors 2 and 9, the PMOS transistors 71 through 73 of the floating well charging circuit 7, and the NMOS transistor 4 are all turned OFF. Therefore, the electrical potential of the output terminal 5 can be promptly increased from the internal power supply voltage VDDIO to the external power supply voltage VTT while the increase of the external direct current Ivtt from the external electrical source terminal T2 into the internal electrical source terminal T1 can be suppressed.

Contrary to the above description about the operations of the second PMOS transistor 9 during which the node 31 reaches the external power supply voltage VTT in the first preferred embodiment of the present invention, the operation of an output circuit, which does not have a transistor such as the second PMOS transistor 9 that turns OFF the first PMOS transistor 2 by the external power supply voltage VTT, is described below.

FIG. 7A is a schematic circuit diagram for describing a conventional output circuit 1A that does not have a transistor such as the second PMOS transistor 9 that turns OFF the first PMOS transistor 2 by the external power supply voltage VTT. FIG. 7B is a waveform diagram for describing the operations of the output circuit 1A in FIG. 7A during which an electrical potential of the output terminal PAD is increased from the ground voltage Vss (the "L" level) to the external power supply voltage VTT. FIG. 7C is a waveform diagram for describing the operations of the output circuit 1A in FIG. 7A during which the electrical potential of the output terminal PAD is increased from the internal power supply voltage VDDIO (the "H" level) to the external power supply voltage VTT. This output circuit 1A is a tri-state buffer which has an input terminal IN, an enable terminal EB, an internal electrical source terminal T1 that receives an internal power supply voltage VDDIO, an output terminal PAD, and an external electrical source terminal T2 which receives an external power supply voltage VTT greater than the internal power supply voltage VDDIO. When the electrical potential of the output terminal PAD is increased from the ground voltage Vss to the external power supply voltage VTT, the electrical potentials of the output terminal PAD and a gate electrode of a first PMOS transistor in the output circuit 1A, that is equivalent to the first PMOS transistor 2 in FIG. 1, are changed similarly as in the semiconductor integrated circuit 1 according to the first preferred embodiment as shown in FIG. 7B. However, when the electrical potential of the output terminal PAD is increased from the internal power supply voltage VDDIO to the external power supply voltage VTT in the output circuit 1A, the electrical potential of the gate electrode of the corresponding first PMOS transistor can not be properly increased to the external power supply voltage VTT. Therefore, an external direct current Ivtt flows from the external electrical source terminal T2 to the internal electrical source terminal T1 through the corresponding first PMOS transistor as shown in FIG. 7B. As a result, the electrical potential of the output terminal PAD can not be increased to the external power supply voltage VTT.

Figure 8B:
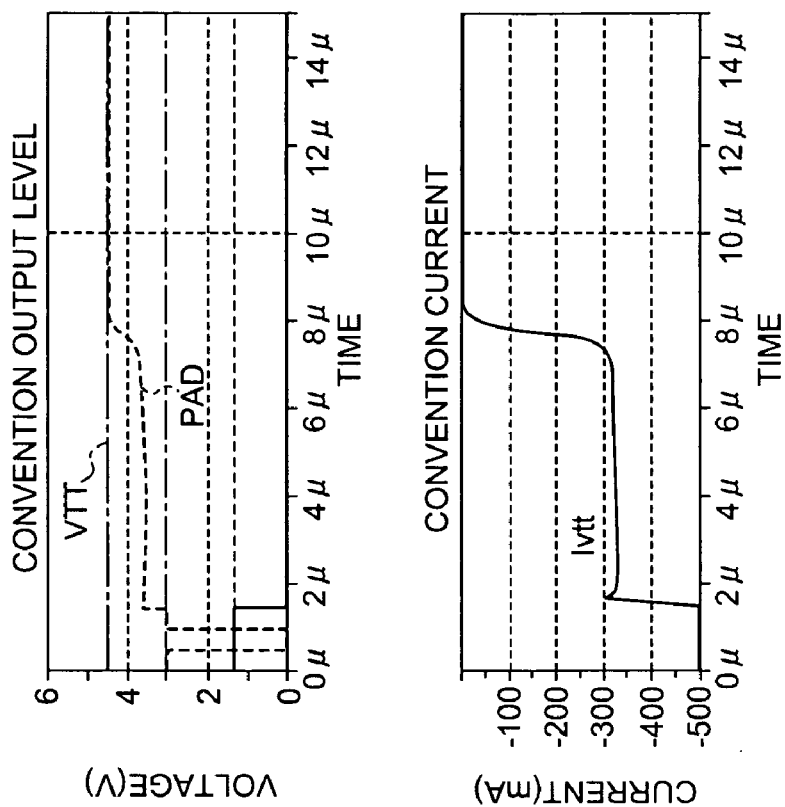
FIGS. 8A and 8B are results of the circuit simulations of the output circuit which does not have the second PMOS transistor that turns OFF the first PMOS transistor by the external power supply voltage.
Figure 8A:
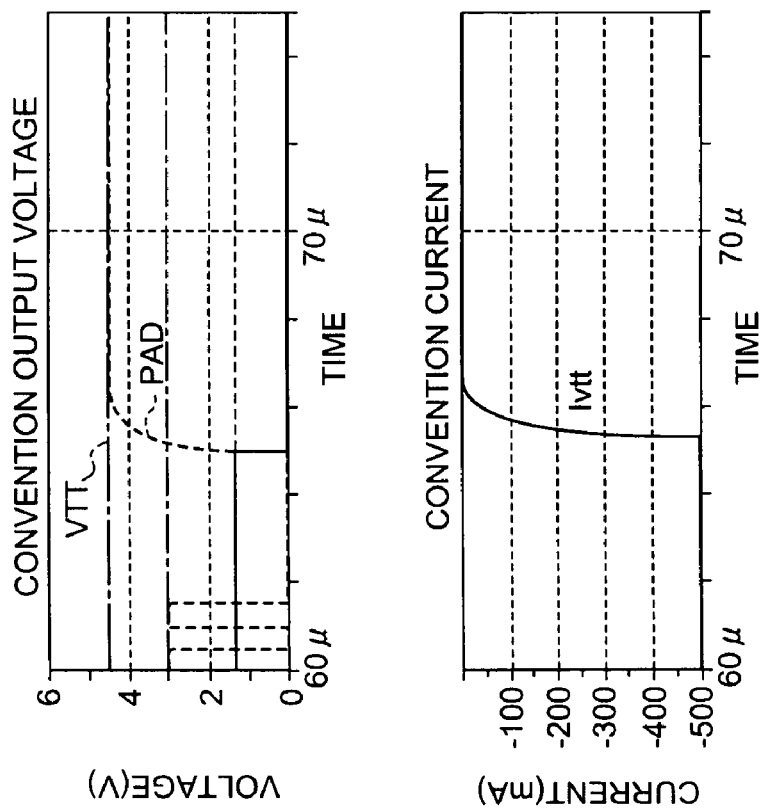
Figure 9B:
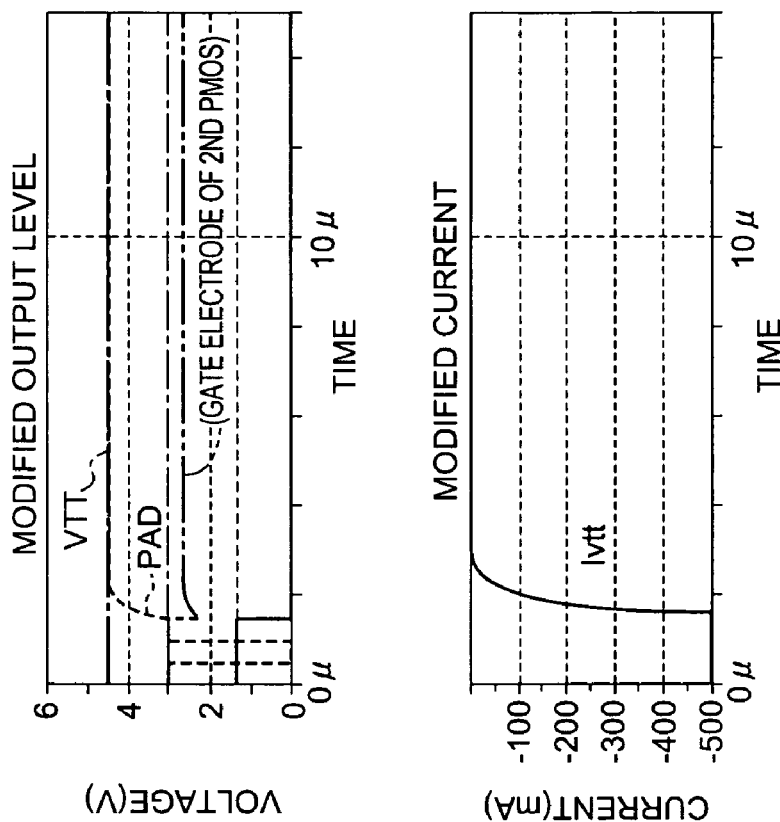
FIGS. 9A and 9B are results of the circuit simulations of the semiconductor integrated circuit in FIG. 1.
Figure 9A:
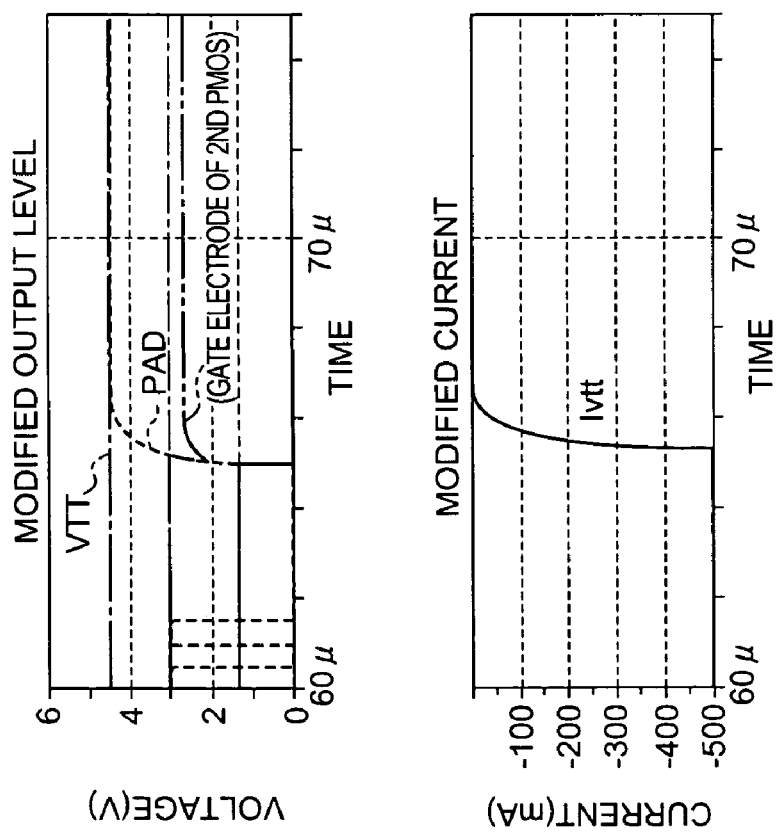

Hereupon, the comparison of a circuit simulation between the semiconductor integrated circuit 1 described in FIG. 1 and the output circuit 1A described in FIG. 7A. FIGS. 8A and 8B are results of the circuit simulations of the output circuit 1A. FIGS. 9A and 9B are results of the circuit simulations of the semiconductor integrated circuit 1.

When the external power supply voltage VTT is supplied to the output terminal PAD on which the electrical potential is kept at the ground voltage Vss in the output circuit 1A, the electrical potential of the output terminal PAD is promptly pulled up from the "L" level to the external power supply voltage VTT as shown in FIG. 8A. However, when the external power supply voltage VTT is supplied to the output terminal PAD on which the electrical potential is kept at the internal power supply voltage VDDIO in the output circuit 1A, the electrical potential of the output terminal PAD can not be promptly pulled up from the "H" level to the external power supply voltage VTT as shown in FIG. 8B. While the electrical potential of the output terminal PAD is increasing at a slow speed, the external direct current Ivtt flows from the external electrical source terminal T2 to the internal electrical source terminal T1.

On the other hand, when the external power supply voltage VTT is supplied to the output terminal 5 on which the electrical potential is kept at the ground voltage Vss in the semiconductor integrated circuit 1, the electrical potential of the output terminal 5 is promptly pulled up from the "L" level to the external power supply voltage VTT as shown in FIG. 9A. Also, when the external power supply voltage VTT is supplied to the output terminal 5 on which the electrical potential is kept at the internal power supply voltage VDDIO in the semiconductor integrated circuit 1, the voltage adjusting circuit 20 provides the bias voltage Vb to the gate electrode of the second PMOS transistor 9 in order to turn ON the second PMOS transistor 9 and then to turn OFF the first PMOS transistor 2. Therefore, the electrical potential of the output terminal 5 can be promptly pulled up from the "H" level to the external power supply voltage VTT as shown in FIG. 9B, contrary to the above-mentioned output circuit 1A. Furthermore, in this instance, the external direct current Ivtt can be restrained from flowing from the external electrical source terminal T2 to the internal electrical source terminal T1.

According to the first preferred embodiment, when the enable signal EB is turned from the "H" level to the "L" level (that is, the semiconductor integrated circuit is turned to the disabled state) with the electrical potential of the output terminal kept at the "H" level (that is, the internal power supply voltage), the voltage adjusting circuit provides the bias voltage lower than the internal power supply voltage to the gate electrode of the second PMOS transistor in order to turn ON the second PMOS transistor. Thus, the external direct current caused by the external power supply voltage flows into the gate electrode of the first PMOS transistor through the second PMOS transistor prior to flowing into the internal electrical source terminal through the first PMOS transistor. Therefore, the gate electrode of the first PMOS transistor promptly receives the external power supply voltage. That is, the first PMOS transistor can be promptly turned OFF shortly after the external power supply voltage is supplied to the output terminal on which the electrical potential is kept at the "H" level. As a result, the electrical potential of the output terminal can be promptly pulled up from the internal power supply voltage to the external power supply voltage, while the increase of the external direct current from the external electrical source terminal into the internal electrical source terminal can be suppressed, that is, while the electrical power consumption in the semiconductor integrated circuit can be suppressed.

Figure 10:
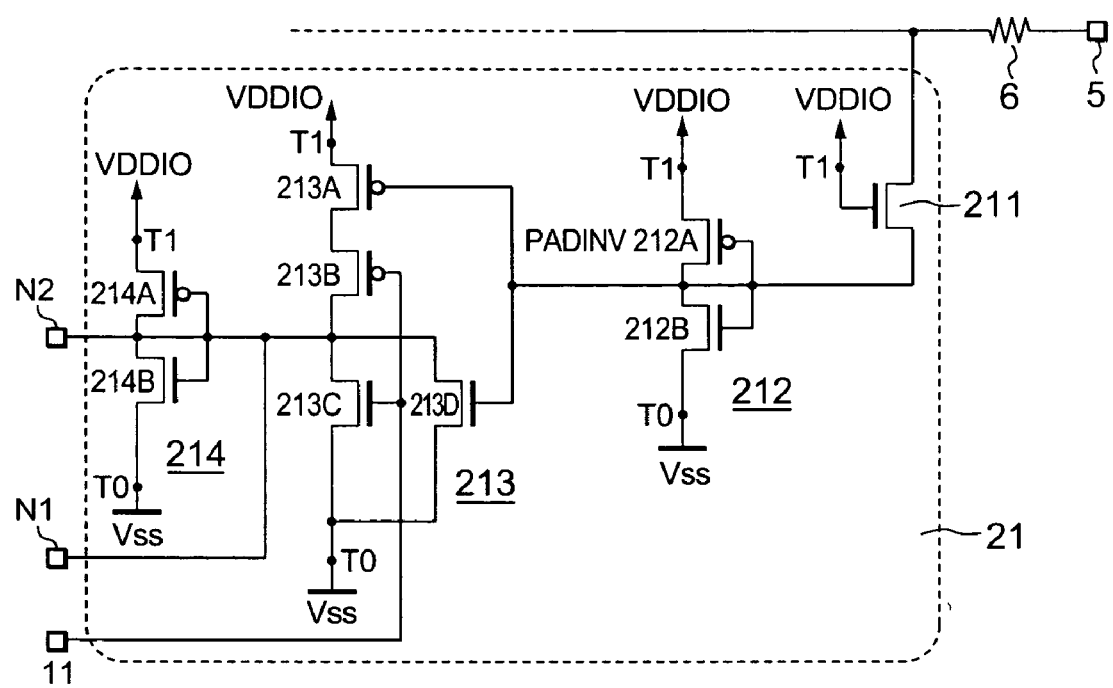
FIG. 10 is a circuit diagram for describing the judgment circuit according to a second preferred embodiment of the present invention.
Figure 11:
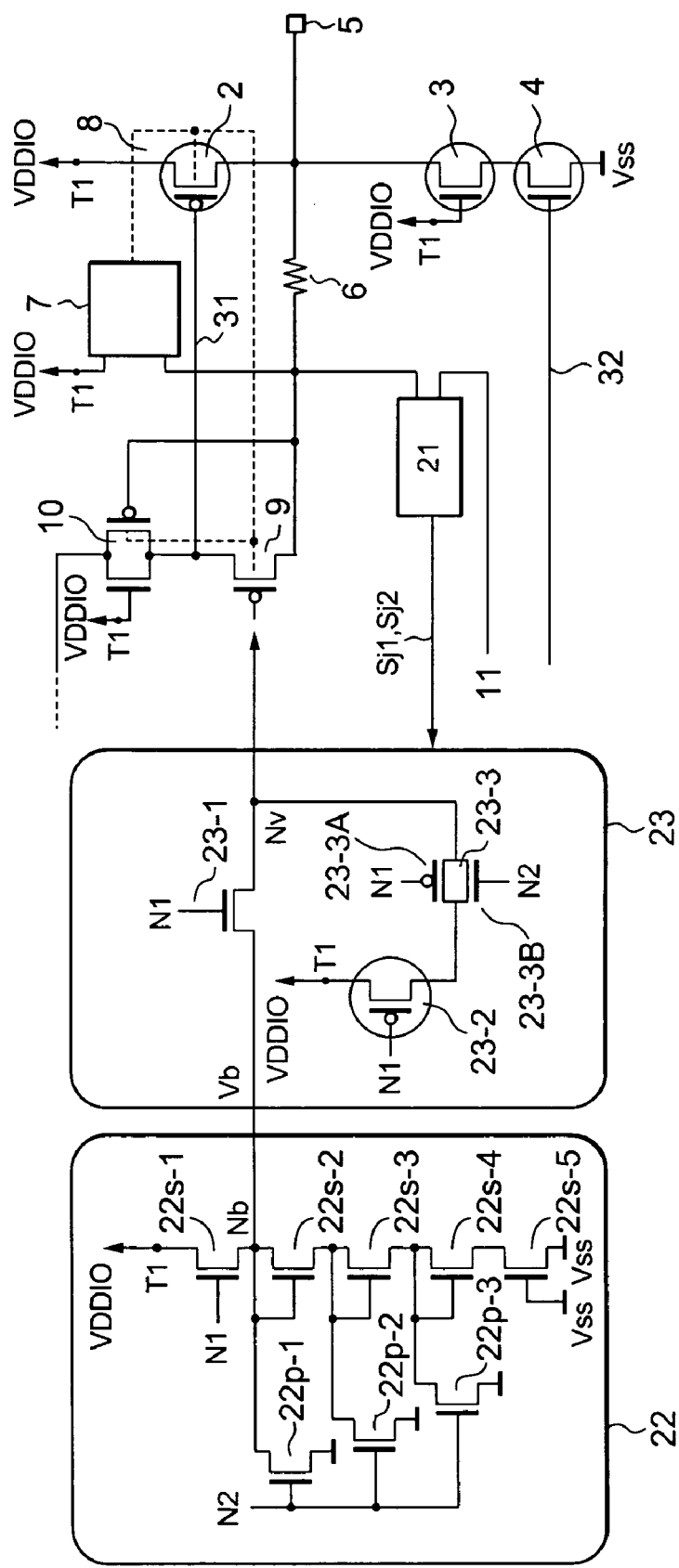
FIG. 11 is a circuit diagram for describing the bias circuit and the voltage switching circuit according to the second preferred embodiment of the present invention.

The semiconductor integrated circuit according to the second preferred embodiment of the present invention has a judgment circuit 21 as shown in FIG. 10, a bias circuit 22 and a voltage switching circuit 23 as shown in FIG. 11. The other configurations of the semiconductor integrated circuit according to the second preferred embodiment are the same as those according to the first preferred embodiment.

The judgment circuit 21 has a first output node N1 from which the first judgment signal Sj1 is output and a second output node N2 from which the second judgment signal Sj2 is output. The judgment circuit 21 further has an NMOS transistor 211, a first inverter 212 and a NOR circuit 213 coupled in series between the input protective resistance element 6 and the first output node N1, and has a second inverter 214 coupled between the first output node N1 and the second output node N2. The NMOS transistor 211 has a source electrode coupled to the output terminal 5 through the input protective resistance element 6, a gate electrode coupled to the internal electrical source terminal T1, and a drain electrode coupled to the first inverter 212. Hereupon, the NMOS transistor 211 is designed so as to provide an electrical potential which is equal to or lower than the internal power supply voltage VDDIO even when the external power supply voltage VTT is supplied to the output terminal 5. The first inverter 212 has PMOS and NMOS transistors 212 A and 212 B coupled in series between the internal electrical source terminal T1 and the ground source terminal T0. The first inverter 212 generates an output signal PADINV for the NOR circuit 213. The NOR circuit 213 has input nodes coupled to the first inverter 212 and the enable terminal 11 and has an output node which outputs the first judgment signal Sj1. That is, the NOR circuit 213 has PMOS transistors 213A and 213B coupled in series between the internal electrical source terminal T1 and the first output node N1. The NOR circuit 213 also has NMOS transistors 213C and 213D coupled in parallel with each other between the first output node N1 and the ground source terminal T0. The PMOS transistor 213 A and the NMOS transistor 213C respectively have gate electrodes coupled to the first inverter 212 so as to receive the output signal PADINV. The PMOS transistor 213B and the NMOS transistor 213C respectively have gate electrodes coupled to the enable terminal 11 so as to receive the enable signal EB. The NOR circuit 213 generates the first judgment signal Sj1 for the first output node N1 and for the second inverter 214. The second inverter 214 has PMOS and NMOS transistors 214A and 214B coupled in series between the internal electrical source terminal T1 and the ground source terminal T0. The second inverter 214 generates the second judgment signal Sj2 for the second output node N2. In addition, the first and second output nodes N1 and N2 are coupled to both of the bias circuit 22 and the voltage switching circuit 23.

The bias circuit 22 has a bias output node Nb from which the bias voltage Vb is output. The bias circuit 22 further has a plurality of NMOS transistors 22s-1 through 22s-N (N is a positive integer) coupled in series between the internal electrical source terminal T1 and the ground source terminal T0, and a plurality of NMOS transistors 22p-1 through 22p-(N−2) respectively coupled to the ground source terminal T0. In this example, it is assumed that the positive integer N is "5". The NMOS transistor 22s-1 has a gate electrode coupled to the first output node N1, a drain electrode coupled to the internal electrical source terminal T1, and a source electrode coupled to the bias output node Nb. The NMOS transistor 22s-2 has gate and drain electrodes coupled to the bias output node Nb. The NMOS transistor 22s-3 has gate and drain electrodes coupled to a source electrode of the NMOS transistor 22s-2. The NMOS transistor 22s-4 has gate and drain electrodes coupled to a source electrode of the NMOS transistor 22s-3, and further has a source electrode coupled to a drain electrode of the NMOS transistor 22s-5. The NMOS transistor 22s-5 has gate and source electrodes coupled to the ground source terminal T0. The NMOS transistors 22p-1 through 22p-3 respectively have gate electrodes coupled to the second output node N2 and source electrodes coupled to the ground source terminal T0. Also, the NMOS transistor 22p-1 has a drain electrode coupled to the bias output node Nb. The NMOS transistor 22p-2 has a drain electrode coupled to the gate and drain electrodes of the NMOS transistor 22s-3. The NMOS transistor 22p-3 has a drain electrode coupled to the gate and drain electrodes of the NMOS transistor 22s-4.

The voltage switching circuit 23 has a voltage providing node Nv from which either the internal power supply voltage VDDIO or the bias voltage Vb appears. The voltage providing node Nv is coupled to the gate electrode of the second PMOS transistor 9. The voltage switching circuit 23 has an NMOS transistor 23-1 coupled between the bias output node Nb and the voltage providing node Nv, and a PMOS transistor 23-2 and a transfer gate 23-3 coupled in series between the internal electrical source terminal T1 and the voltage providing node Nv. The NMOS transistor 23-1 has source electrode coupled to the bias output node Nb, a drain electrode coupled to the voltage providing node Nv, and a gate electrode coupled to the first output node N1 of the judgment circuit 21. The PMOS transistor 23-2 has a source electrode coupled to the internal electrical source terminal T1, a drain electrode coupled to the transfer gate 23-3, and a gate electrode coupled to the first output node N1 of the judgment circuit 21. The transfer gate 23-3 has a PMOS transistor 23-3A and an NMOS transistor 23-3B coupled in parallel with each other between the PMOS transistor 23-2 and the voltage providing node Nv. The PMOS transistor 23-3A has a gate electrode coupled to the first output node N1 of the judgment circuit 21, and the NMOS transistor 23-3B has a gate electrode coupled to the second output node N2 of the judgment circuit 21.

The operation of the semiconductor integrated circuit according to the second preferred embodiment of the present invention is described in detail below and in sequence from the above-mentioned first to fourth operation case as shown in Table 2.

First of all, the operation of the judgment circuit 21 is described below. When the electrical potential of the output terminal 5 is kept at the "H" level, the NMOS transistor 211 provides a signal which is kept at the "H" level to the first inverter 212. Also, when the electrical potential of the output terminal 5 is kept at the "L" level, the NMOS transistor 211 provides a signal which is kept at the "L" level to the first inverter 212. The first inverter 212 provides a logical signal which is shown in Table 2 to the NOR circuit 213. That is, when the electrical potential of the output terminal 5 is kept at the "H" level, the first inverter 212 provides a logical signal which is turned to the "L" level to the gate electrodes of the PMOS transistor 213A and the NMOS transistor 213D. Also, when the electrical potential of the output terminal 5 is kept at the "L" level, the first inverter 212 provides a logical signal which is turned to the "H" level to the gate electrodes of the PMOS transistor 213A and the NMOS transistor 213D. On the other hand, the NOR circuit 213 receives the enable signal EB and then provides the first judgment signal Sj1 to the first output node N1 and the second inverter 214. That is, when the electrical potential of the output terminal 5 is kept at the "L" level and the enable signal EB is kept at the "H" level, the NOR circuit 213 provides a logical signal which is turned to the "L" level to the first output node N1 and the gate electrodes of the PMOS transistor 214A and the NMOS transistor 214B as shown in the first operation case of Table 2. When the electrical potential of the output terminal 5 is kept at the "H" level and the enable signal EB is kept at the "H" level, the NOR circuit 213 provides a logical signal which is turned to the "L" level to the first output node N1 and the gate electrodes of the PMOS transistor 214A and the NMOS transistor 214B as shown in the second operation case of Table 2. When the electrical potential of the output terminal 5 is kept at the "L" level and the enable signal EB is turned to the "L" level, the NOR circuit 213 provides a logical signal which is turned to the "L" level to the first output node N1 and the gate electrodes of the PMOS transistor 214A and the NMOS transistor 214B as shown in the third operation case of Table 2. When the electrical potential of the output terminal 5 is kept at the "H" level and the enable signal EB is turned to the "L" level, the NOR circuit 213 provides a logical signal which is turned to the "H" level to the first output node N1 and the gate electrodes of the PMOS transistor 214A and the NMOS transistor 214B as shown in the fourth operation case of Table 2. Then, the second inverter 214 generates a signal which is corresponding to the output signal from the NOR circuit 213 for the second output node N2. Therefore, in the fourth operation case, the judgment circuit 21 generates a pair of the first and second judgment signals Sj1 and Sj2 different than any pair of the first and second judgment signals Sj1 and Sj2 in the first through third operation case.

Next, the operations of the bias circuit 22 and the voltage switching circuit 23 is described below. As mentioned above, the first judgment signal Sj1 which is kept at the "L" level and the second judgment signal Sj2 which is kept at the "H" level are input to both of the bias circuit 22 and the voltage switching circuit 23 in the first through third operation case. On such an occasion as this, the NMOS transistor 23-1 of the voltage switching circuit 23 is turned OFF, and both of the PMOS transistor 23-2 and the transfer gate 23-3 are turned ON. Thus, the internal power supply voltage VDDIO is supplied to the gate electrode of the second PMOS transistor 9 through the voltage providing node Nv. Also, since the NMOS transistor 22s-1 is turned OFF and the NMOS transistors 22p-1 through 22p-3 are turned ON, the bias output node Nb of the bias circuit 22 is turned to the "L" level.

On the other hand, the first judgment signal Sj1 which is kept at the "H" level and the second judgment signal Sj2 which is kept at the "L" level are input to both of the bias circuit 22 and the voltage switching circuit 23 in the fourth operation case. Since the NMOS transistors 22p-1 through 22p-3 are turned OFF in this instance, the NMOS transistors 22s-2 through 22s-5 are all turned ON. Also, the NMOS transistor 22s-1 is turned ON responsive to the first judgment signal Sj1 which is kept at the "H" level. As a result, the bias voltage Vb which is lower than the internal power supply voltage VDDIO approximately by a threshold voltage of the NMOS transistor 22s-1 is output from the bias output node Nb. On such an occasion as this, the PMOS transistor 23-2 and the transfer gate 23-3 of the voltage switching circuit 23 are turned OFF and the NMOS transistor 23-1 of the voltage switching circuit 23 is turned ON. Therefore, the bias voltage Vb is supplied to the gate electrode of the second PMOS transistor 9 through the NMOS transistor 23-1. Thus, the voltage adjusting circuit 20 can provide the bias voltage Vb to the gate electrode of the second PMOS transistor 9 just when the electrical potential of the output terminal 5 is kept at the "H" level and the enable signal EB is turned to the "L" level.

According to the second preferred embodiment, the voltage adjusting circuit properly and promptly provides the bias voltage to the gate electrode of the second PMOS transistor by simple circuit configuration, just when the enable signal is turned from the "H" level to the "L" level with the electrical potential of the output terminal kept at the "H" level. Furthermore, when the voltage adjusting circuit provides the internal power supply voltage to the gate electrode of the second PMOS transistor, the NMOS transistor of the bias circuit coupled between the internal electrical source terminal and the bias output node is turned OFF and the bias output node is kept at the ground voltage. Therefore, the second PMOS transistor can be turned ON while the electrical current consumption of the voltage adjusting circuit is suppressed. That is, the first PMOS transistor can be promptly turned OFF shortly after the external power supply voltage is supplied to the output terminal on which the electrical potential is kept at the "H" level while the electrical current consumption of semiconductor integrated circuit is suppressed. Also, since the PMOS and NMOS transistors in the voltage adjusting circuit are not formed on the floating well, the voltage adjusting circuit can be easily designed by a design method (for example, a Sea Of Gate design method) in which a size of a transistor is previously defined.

Figure 12:
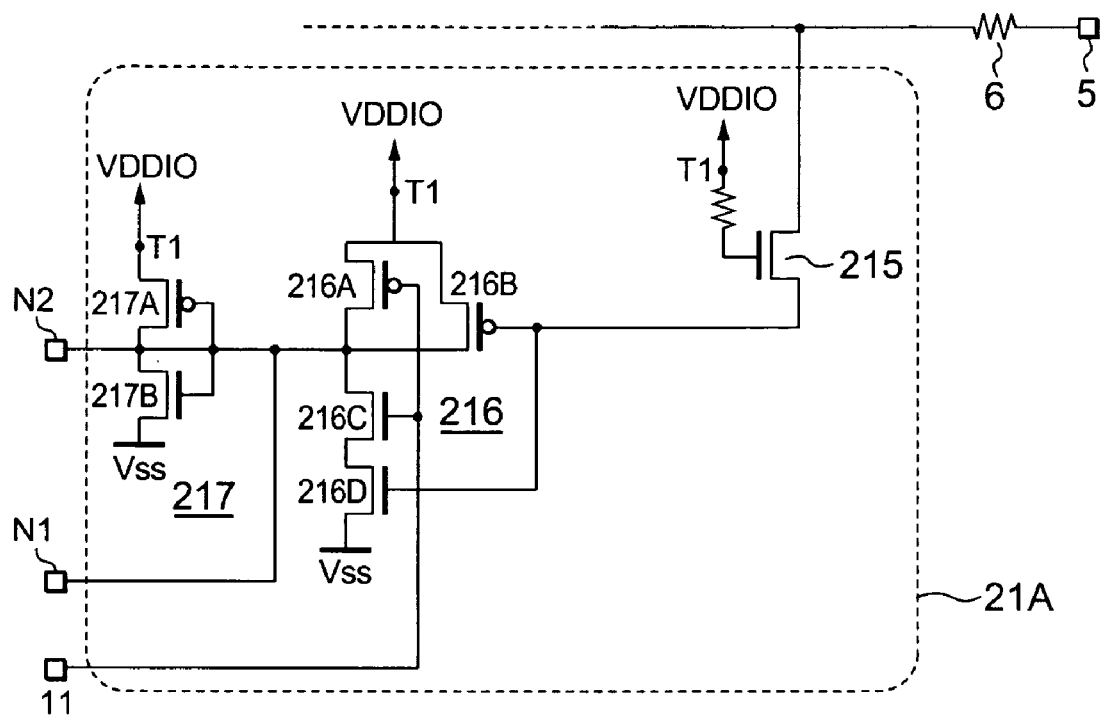
FIG. 12 is a circuit diagram for describing a judgment circuit according to a third preferred embodiment of the present invention.

FIG. 12 is a circuit diagram for describing a judgment circuit 21A according to a third preferred embodiment of the present invention. In the semiconductor integrated circuit according to the third preferred embodiment, the judgment circuit 21A is used instead of the judgment circuit 21 in the semiconductor integrated circuit according to second preferred embodiment. In the third embodiment, it is assumed that the semiconductor integrated circuit 1 is enabled when the enable signal EB is kept at the "L" level and the semiconductor integrated circuit 1 is disabled when the enable signal EB is kept at the "H" level.

The judgment circuit 21A has a first output node N1 from which the first judgment signal Sj1 is output and a second output node N2 from which the second judgment signal Sj2 is output. The judgment circuit 21A further has an NMOS transistor 215 and a NAND circuit 216 coupled in series between the input protective resistance element 6 and the first output node N1, and has an inverter 217 coupled between the first output node N1 and the second output node N2. The NMOS transistor 215 has a source electrode coupled to the output terminal 5 through the input protective resistance element 6, a gate electrode coupled to the internal electrical source terminal T1, and a drain electrode coupled to the NAND circuit 216. Hereupon, the NMOS transistor 215 is designed so as to provide an electrical potential which is equal to or lower than the internal power supply voltage VDDIO even when the external power supply voltage VTT is supplied to the output terminal 5. The NAND circuit 216 has input nodes coupled to the NMOS transistor 215 and the enable terminal 11, and has an output node which outputs the first judgment signal Sj1. That is, the NAND circuit 216 has PMOS transistors 216A and 216B coupled in parallel with each other between the internal electrical source terminal T1 and the first output node N1. The NAND circuit 216 also has NMOS transistors 216C and 216D coupled in series between the first output node N1 and the ground source terminal T0. The PMOS transistor 216A and the NMOS transistor 216C respectively have gate electrodes coupled to the enable terminal 11 so as to receive the enable signal EB. The PMOS transistor 216B and the NMOS transistor 216D respectively have gate electrodes coupled to the drain electrode of the NMOS transistor 215. The NAND circuit 216 generates the first judgment signal Sj1 for the first output node N1 and for the inverter 217. The inverter 217 has PMOS and NMOS transistors 217A and 217B coupled in series between the internal electrical source terminal T1 and the ground source terminal T0. The inverter 217 generates the second judgment signal Sj2 for the second output node N2. In addition, the first and second output nodes N1 and N2 are coupled to both of the bias circuit 22 and the voltage switching circuit 23.

The operation of the semiconductor integrated circuit according to the third preferred embodiment of the present invention is described in detail below and in sequence from the above-mentioned first to fourth operation case as shown in Table 3. As shown in Table 3, the first judgment signal Sj1 is turned to the "H" level and the second judgment signal Sj2 is turned to the "L" level in the first through third operation case. On the contrary, the first judgment signal Sj1 is turned to the "L" level and the second judgment signal Sj2 is turned to the "H" level in the fourth operation case as shown in Table 3. That is, in the fourth operation case, the judgment circuit 21 generates a pair of the first and second judgment signals Sj1 and Sj2 different than any pair of the first and second judgment signals Sj1 and Sj2 in the first through third operation case. Therefore, the gate electrode of the second PMOS transistor 9 receives the internal power supply voltage VDDIO in the first through third operation case and receives the bias voltage Vb in the fourth operation case. Thus, as well as in the second preferred embodiment, the first PMOS transistor 2 can be promptly turned OFF shortly after the external power supply voltage VTT is supplied to the output terminal 5 on which the electrical potential is kept at the "H" level while the electrical current consumption of semiconductor integrated circuit is suppressed.

According to the third preferred embodiment, the voltage adjusting circuit properly and promptly provides the bias voltage to the gate electrode of the second PMOS transistor by simple circuit configuration, just when the enable signal is turned from the "L" level to the "H" level with the electrical potential of the output terminal kept at the "H" level. As a result, the first PMOS transistor can be promptly turned OFF shortly after the external power supply voltage is supplied to the output terminal on which the electrical potential is kept at the "H" level.

TABLE 1

| Operation Case | IN | EB | 2nd PMOS 9 (Gate electrode) | Output Terminal 5 |
|---|---|---|---|---|
| 1 | L | H | VDDIO | L |
| 2 | H | H | VDDIO | H |
| 3 | L | L | VDDIO | L to VTT |
| 4 | H | L | Vb | H to VTT |

TABLE 2

| Operation Case | IN | EB | PADINV | Sj1 | Sj2 | 2nd PMOS 9 (Gate electrode) | Output Terminal 5 |
|---|---|---|---|---|---|---|---|
| 1 | L | H | H | L | H | VDDIO | L |
| 2 | H | H | L | L | H | VDDIO | H |
| 3 | L | L | H | L | H | VDDIO | L to VTT |
| 4 | H | L | L | H | L | Vb | H to VTT |

TABLE 3

| Operation Case | IN | EB | Sj1 | Sj2 | 2nd PMOS 9 (Gate electrode) | Output Terminal 5 |
|---|---|---|---|---|---|---|
| 1 | L | L | H | L | VDDIO | L |
| 2 | H | L | H | L | VDDIO | H |
| 3 | L | H | H | L | VDDIO | L to VTT |
| 4 | H | H | L | H | Vb | H to VTT |

What is claimed is:

1. A semiconductor integrated circuit, comprising:
an electrical source terminal which receives a power supply voltage;
an output terminal which outputs an output signal;
an enable terminal which receives an enable signal, wherein the enable signal enables an operation of the semiconductor integrated circuit;
a first transistor coupled between the electrical source terminal and the output terminal;
a second transistor coupled between a control electrode of the first transistor and the output terminal; and
a voltage adjusting circuit coupled with a control electrode of the second transistor, the output terminal and the enable terminal, wherein the voltage adjusting circuit controls the second transistor in accordance with electrical potentials of the output terminal and the enable terminal.

2. The semiconductor integrated circuit according to claim 1, wherein the voltage adjusting circuit selectively outputs the power supply voltage or a bias voltage which is lower than the power supply voltage to the control electrode of the second transistor.

3. The semiconductor integrated circuit according to claim 2, wherein the voltage adjusting circuit outputs the bias voltage to the control electrode of the second transistor so as to turn ON the second transistor when the output terminal receives an external voltage which is higher than the power supply voltage.

4. The semiconductor integrated circuit according to claim 3, wherein the first transistor is turned OFF after the second transistor is turned ON.

5. The semiconductor integrated circuit according to claim 2, wherein the voltage adjusting circuit comprises:
a judgment circuit coupled with the enable terminal and the output terminal, wherein the judgment circuit generates first and second judgment signals based on the electrical potentials of the output terminal and the enable terminal;
a bias circuit which generates the bias voltage; and
a voltage switching circuit coupled with the judgment circuit, the electrical source terminal and the bias circuit, wherein the voltage switching circuit selectively outputs the power supply voltage or the bias voltage to the control electrode of the second transistor in response to the first and second judgment signals.

6. The semiconductor integrated circuit according to claim 5, wherein the judgment circuit comprises:
a NOR circuit having input nodes coupled to the output terminal and the enable terminal and having an output node which outputs the first judgment signal; and
an inverter having an input node coupled to the output node of the NOR circuit and having an output node which outputs the second judgment signal.

7. The semiconductor integrated circuit according to claim 5, wherein the judgment circuit comprises:
a NAND circuit having input nodes coupled to the output terminal and the enable terminal and having an output node which outputs the first judgment signal; and
an inverter having an input node coupled to the output node of the NAND circuit and having an output node which outputs the second judgment signal.

8. The semiconductor integrated circuit according to claim 5, wherein the bias circuit includes a plurality of NMOS transistors coupled in series between the electrical source terminal and a ground source terminal, the bias circuit generating the bias voltage from a node coupled between two of the plurality of NMOS transistors.

9. The semiconductor integrated circuit according to claim 8, wherein the bias circuit is coupled to the judgment circuit so that the bias voltage is generated in response to the first and second judgment signals.

10. The semiconductor integrated circuit according to claim 5, wherein the voltage switching circuit comprises:
a first switching transistor coupled between the bias circuit and the second transistor, the first switching transistor being controlled by the first judgment signal;
a second switching transistor coupled between the electrical source terminal and the second transistor, the second switching transistor being controlled by the first judgment signal; and
a switching transfer circuit coupled between the second switching transistor and the second transistor, the switching transfer circuit being controlled by the first and second judgment signals.

11. The semiconductor integrated circuit according to claim 1, further comprising:
a charging circuit coupled between the electrical source terminal and the output terminal, wherein the charging circuit provides the power supply voltage to each of the first and second transistors.

12. The semiconductor integrated circuit according to claim 1, wherein the first and second transistors are PMOS transistors.

13. The semiconductor integrated circuit according to claim 1, further comprising:
a protective resistance element coupled between the output terminal and the second transistor.

14. A semiconductor integrated circuit, comprising:
an electrical source terminal which receives a power supply voltage;
an output terminal which outputs an output signal;

a first transistor coupled between the electrical source terminal and the output terminal;

a second transistor coupled between a control electrode of the first transistor and the output terminal; and a voltage adjusting circuit coupled between the output terminal and a control electrode of the second transistor, wherein the voltage adjusting circuit turns ON the second transistor when the output terminal receives an external voltage which is higher than the power supply voltage.

15. The semiconductor integrated circuit according to claim 14, wherein the first transistor is turned OFF by the voltage adjusting circuit and the second transistor after the output terminal receives the external voltage.

16. The semiconductor integrated circuit according to claim 14, wherein the voltage adjusting circuit generates the power supply voltage or a bias voltage which is lower than the power supply voltage for the second transistor.

17. The semiconductor integrated circuit according to claim 16, further comprising:

an enable terminal, coupled to the voltage adjusting circuit, that receives an enable signal that enables an operation of the semiconductor integrated circuit.

18. The semiconductor integrated circuit according to claim 17, wherein the voltage adjusting circuit comprises:

a judgment circuit coupled with the enable terminal and the output terminal, wherein the judgment circuit generates first and second judgment signals based on electrical potentials of the output terminal and the enable terminal;

a bias circuit which generates the bias voltage; and a voltage switching circuit coupled with the judgment circuit, the electrical source terminal and the bias circuit, wherein the voltage switching circuit selectively outputs the power supply voltage or the bias voltage to the control electrode of the second transistor in response to the first and second judgment signals.

19. The semiconductor integrated circuit according to claim 18, wherein the judgment circuit comprises:

a NOR circuit having input nodes coupled to the output terminal and the enable terminal and having an output node which outputs the first judgment signal; and an inverter having an input node coupled to the output node of the NOR circuit and having an output node which outputs the second judgment signal.

20. The semiconductor integrated circuit according to claim 18, wherein the judgment circuit comprises:

a NAND circuit having input nodes coupled to the output terminal and the enable terminal and having an output node which outputs the first judgment signal; and an inverter having an input node coupled to the output node of the NAND circuit and having an output node which outputs the second judgment signal.

21. The semiconductor integrated circuit according to claim 18, wherein the bias circuit includes a plurality of NMOS transistors coupled in series between the electrical source terminal and a ground source terminal, the bias circuit generating the bias voltage from a node coupled between two of the plurality of NMOS transistors.

22. The semiconductor integrated circuit according to claim 21, wherein the bias circuit is coupled with the judgment circuit so that the bias voltage is generated in response to the first and second judgment signals.

23. The semiconductor integrated circuit according to claim 18, wherein the voltage switching circuit comprises:

a first switching transistor coupled between the bias circuit and the second transistor, the first switching transistor being controlled by the first judgment signal;

a second switching transistor coupled between the electrical source terminal and the second transistor, the second switching transistor being controlled by the first judgment signal; and a switching transfer circuit coupled between the second switching transistor and the second transistor, the switching transfer circuit being controlled by the first and second judgment signals.

24. The semiconductor integrated circuit according to claim 14, further comprising:

a charging circuit coupled between the electrical source terminal and the output terminal, wherein the charging circuit provides the power supply voltage to each of the first and second transistors.

25. The semiconductor integrated circuit according to claim 14, wherein the first and second transistors are PMOS transistors.

26. The semiconductor integrated circuit according to claim 14, further comprising:

a protective resistance element coupled between the output terminal and the second transistor.

* * * * *